(12) United States Patent
Sun et al.

(10) Patent No.: US 9,633,151 B1
(45) Date of Patent: Apr. 25, 2017

(54) METHODS, SYSTEMS, AND COMPUTER PROGRAM PRODUCT FOR VERIFYING ELECTRONIC DESIGNS WITH CLOCK DOMAIN CROSSING PATHS

(71) Applicant: Cadence Design Systems, Inc., San Jose, CA (US)

(72) Inventors: Xiaoyang Sun, Shanghai (CN); Marcus Vinicius da Mata Gomes, San Jose, CA (US); Andrea Iabrudi Tavares, Belo Horizonte (BR); Lawrence Loh, Milpitas, CA (US); Fabiano Peixoto, Belo Horizonte (BR)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/675,699

(22) Filed: Mar. 31, 2015

(51) Int. Cl.
*G06F 17/50* (2006.01)

(52) U.S. Cl.
CPC .................................. *G06F 17/504* (2013.01)

(58) Field of Classification Search
CPC ............. G06F 17/5031; G06F 2217/62; G06F 2217/84; G06F 1/12; G06F 13/1689; G11C 7/222; G11C 11/4076
USPC .................................. 716/106, 108, 113, 134
See application file for complete search history.

(56) References Cited

U.S. PATENT DOCUMENTS

| | | | |
|---|---|---|---|
| 7,289,946 B1 * | 10/2007 | Lee ................... | G01R 31/31855 703/16 |
| 8,438,516 B2 | 5/2013 | Ly et al. | |
| 8,661,383 B1 * | 2/2014 | Dobkin ............... | G06F 17/5081 716/102 |
| 2005/0268265 A1 * | 12/2005 | Ly ....................... | G06F 17/5031 716/108 |
| 2005/0273741 A1 * | 12/2005 | Lahner ................ | G06F 17/5045 716/108 |

OTHER PUBLICATIONS

Ly, Tai, Neil Hand, and Chris Ka-kei Kwok. "Formally verifying clock domain crossing jitter using assertion-based verification." Design & Verification Conference. 2004.
"What Is Metastability?" URL: http://www.asic-world.com/tidbits/metastability.html, Feb. 9, 2014, Accessed on Feb. 20, 2015.

* cited by examiner

*Primary Examiner* — Nghia Doan
(74) *Attorney, Agent, or Firm* — Vista IP Law Group, LLP

(57) ABSTRACT

Various mechanisms and approaches identify a first electronic design component at least by traversing at least a portion of the electronic design and generate a representation of the electronic design by interconnecting one or more duplicated electronic design components within the representation. The first electronic design component may include a destination electronic design component with a backward traversal of the electronic design. One or more fan-in electronic design components may be duplicated into the one or more duplicated electronic design components. One or more CDC effect models are automatically injected into the representation by adding the one or more CDC effect models along one or more paths in the representation. Proof results are generated at least via proving or disproving one or more checkers for the electronic design by verifying or simulating the representation with the one or more CDC effect models that are automatically injected into the representation.

20 Claims, 14 Drawing Sheets

METHODS, SYSTEMS, AND COMPUTER PROGRAM PRODUCT FOR VERIFYING ELECTRONIC DESIGNS WITH CLOCK DOMAIN CROSSING PATHS

BACKGROUND

In conventional verification techniques, users normally have to specify the clock sources after the electronic design is compiled into an EDA (electronic design automation) tool. The EDA tool may automatically identify the CDC (clock domain crossing) paths based on the clock sources specified by the users. The EDA tool may then run structural rule checker which reports warnings and/or errors according to a configured rule set of structural rules. Users may decide whether to modify the RTL designs or bypass the warnings and/or errors according their design intent. After the structural rule checking, EDA tool may inject a CDC-effect module with the introduction provided by users. In some cases, users may allow the EDA tool to inject the CDC-effect module along a clock domain crossing path if the CDC path is simple or satisfies the structural rules. In some other cases, users may have to instruct the EDA tool where to inject the CDC-effect module if the CDC path is complex as decided by the users. Users may then verify the electronic circuit of interest via either simulation or verification techniques with the CDC-effect module injected or which circuit component is to be replaced with a CDC-effect module in the RTL (register transfer level) design. In these approaches, users may need to identify the CDC paths in the RTL design, decide where the inject the CDC-effect module along a CDC path, provide instructions to the EDA tool to modify intermediate design data of the electronic design for verification, and run the same target properties to verify the electronic design.

Users cannot, however, randomly select any circuit components to replace with CDC-effect modules. Rather, CDC-effect module injection requires an insurmountable amount of time, efforts, and expertise on the part of the designers in order to correctly accommodate the CDC-effect models during design verification or simulation. In some cases where structural rules are involved in the verification of an electronic design, EDA (electronic design automation) tools may not necessarily report structural connectivity. This lack of structural connectivity further exacerbates the difficulties in verification of electronic designs having cross clock domain paths. Moreover, due to the increasingly more clock domains and complexities in modern electronic designs, it is extremely difficult, if not entirely impossible, to determine correct locations to inject CDC effects or CDC effect models or to avoid the overly pessimistic, overly optimistic, or erroneous user-defined CDC effect injection in order to correctly account for CDC effects in verification of electronic designs at early design stages.

To improve the accuracy, coverage of conventional verification or simulation techniques that determine whether an electronic design conforms to the specification, there exists a need for methods, systems, and computer program products for verifying an electronic design with clock domain crossing paths.

SUMMARY

Disclosed are method(s), system(s), and article(s) of manufacture for verifying an electronic design with clock domain crossing paths in one or more embodiments. One or more embodiments are directed at a method for verifying an electronic design with clock domain crossing paths. In these one or more embodiments, the method may identify, at a clock domain crossing (CDC) identification mechanism coupled with at least one micro-processor of a computing system and a design traversal mechanism, a first electronic design component at least by traversing at least a portion of the electronic design. A representation of the electronic design may be generated at a design duplication mechanism at least by interconnecting one or more duplicated electronic design components. One or more CDC effect models may be automatically injected with a CDC injection mechanism into the presentation by adding the one or more CDC effect models along one or more paths in the representation of the electronic design.

Proof results may be generated with a verification mechanism or a simulation mechanism at least by proving or disproving one or more checkers for the electronic design by verifying or simulating the representation with the one or more CDC effect models. In some of these embodiments, a CDC path operatively coupled with the first electronic design component in the electronic design may be identified with a CDC identification mechanism. The first electronic design may include a destination electronic design component associated with a CDC path connecting two or more clock domains where the design traversal mechanism backward traverses the electronic design in some embodiments. In these embodiments, one or more fan-in electronic design components for the first electronic design component may be identified for duplication into the one or more duplicated electronic design components.

The one or more duplicated electronic design components may further be interconnected in the representation of the electronic design by using at least the connectivity information of the electronic design. In some embodiments, the representation of the electronic design includes an in-memory representation of the electronic design, and the one or more duplicated electronic design components are interconnected in the in-memory representation of the electronic design by using at least connectivity information of the electronic design. A path in the representation of the electronic design may be removed in determining the representation of the electronic design, and one or more additional paths may be created by interconnecting the first electronic design component with at least one duplicated electronic design component of the one or more electronic design components.

In addition or in the alternative, one or more CDC rules for the electronic design may be identified, and one or more locations for the one or more CDC effect models in the representation of the electronic design may be determined based in part or in whole upon the one or more CDC rules. An example of a first CDC rule may include identifying a first time-dependent electronic design component having multiple inputs, determining whether the multiple inputs belong to different clock domains, and injecting a first CDC effect model at an output of the time-dependent electronic design component, where the multiple inputs of the time-dependent electronic design component are determined to belong to the different clock domains. Another example of a second CDC rule may include identifying a second time-dependent electronic design component having an output propagated to multiple electronic design components, determining whether the multiple electronic design components belong to a same clock domain, and injecting a second CDC effect model at outputs of the multiple electronic design component, where the multiple electronic design components are determined to belong to the same clock domain.

Depending upon the proof results, an iterative process may be performed to determine a property corresponding to at least one checker of the one or more checkers, modify the electronic design, the at least one checker, or the property by making one or more changes based in part or in whole upon the proof results for the at least one checker, prove or disprove the at least one checker with the one or more changes, and commit the one or more changes into a persistent storage device.

Some embodiments are directed at a hardware system that may be specially configured to perform any of the methods, processes, or sub-processes disclosed herein to improve the efficiencies (e.g., with a shorter runtime, a smaller number of computations or processor cycles, etc. for verification tasks by avoiding erroneous, redundant, or insufficient CDC effects manually injected), improve the effectiveness (e.g., by eliminating overly pessimistic, overly optimistic, or guesswork involved in manual injection of CDC effects or CDC effect models), and/or performance (e.g., by improving the coverage of the verification or simulation, etc.) of verification or simulation tasks to determine whether an electronic design conforms to its specification. It shall be noted that in the foregoing paragraphs, the recitation of certain mechanisms illustrates how various acts may be performed by way of examples and is not intended to limit the performance of these various acts to only these recited mechanisms or to preclude the possibility of performing these various acts by other means to achieve identical or similar purposes.

The hardware system may include at least one microprocessor or at least one processor core (collectively "processor" or "micro-processor"), which executes one or more threads of execution and is coupled to a system bus architecture and an external bus architecture to perform any of the methods, processes, or sub-processes disclosed herein in some embodiments. The hardware system may further include one or more forms of non-transitory machine-readable storage media or storage devices to temporarily or persistently store various types of data or information. Some exemplary modules or components of the hardware system may be found in the System Architecture Overview section below.

Some embodiments are directed at an article of manufacture that includes a non-transitory machine-accessible storage medium having stored thereupon a sequence of instructions which, when executed by at least one processor, causes the at least one processor to perform any of the methods, processes, or sub-processes disclosed herein. Some exemplary forms of the non-transitory machine-readable storage media may also be found in the System Architecture Overview section below.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1A:
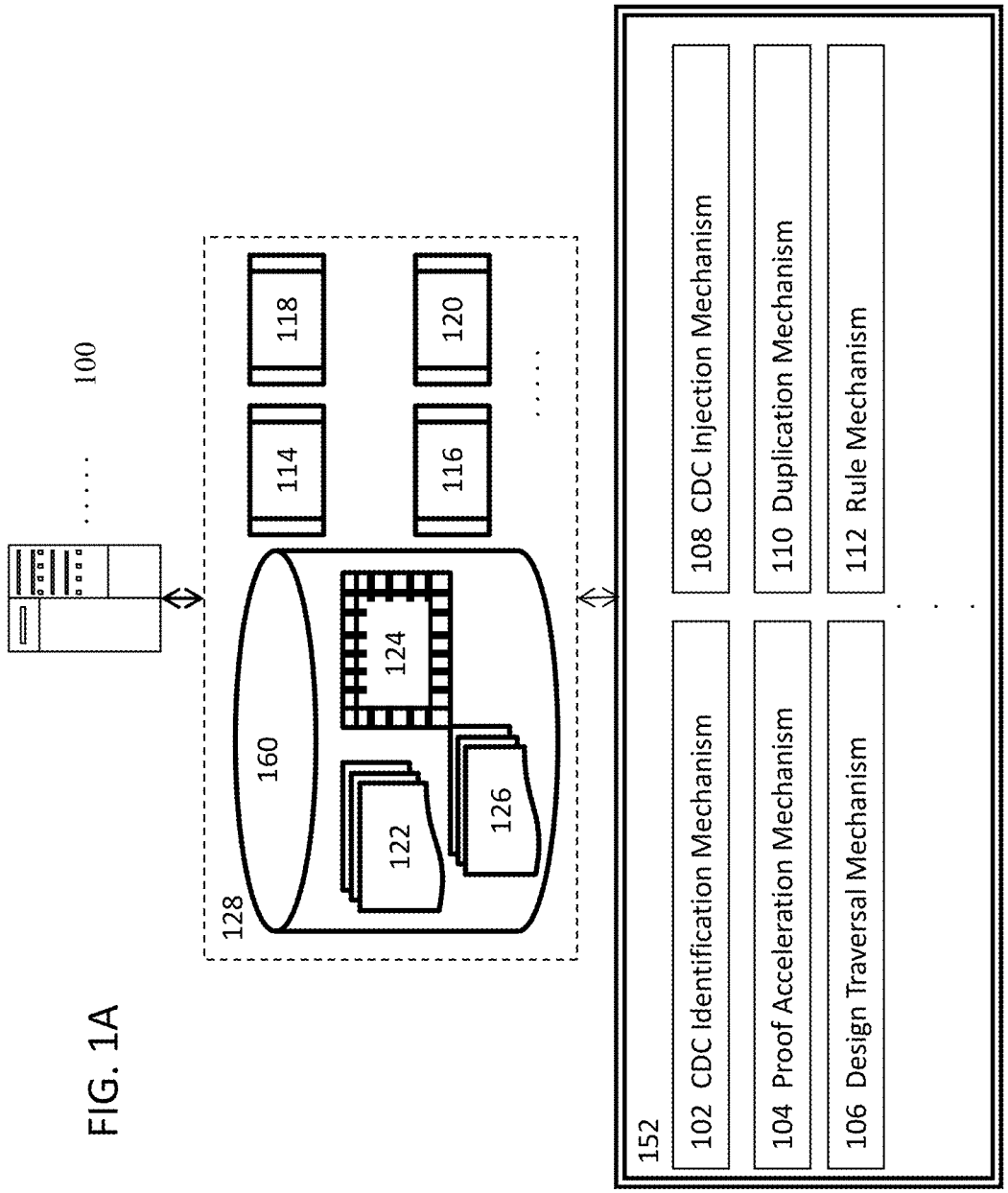
FIG. 1A illustrates a high level block diagram for a system for verifying an electronic design with clock domain crossing paths in one or more embodiments.

Various embodiments of the invention are directed to methods, systems, and computer program products for verifying an electronic design with clock domain crossing paths.

Other objects, features, and advantages of the invention are described in the detailed description, figures, and claims.

In one or more embodiments, various techniques described herein automatically identify CDC paths in an electronic design, identify an electronic design component (e.g., a destination or a source flip-flop or register) for a CDC path, and traverse at least a portion of the electronic design from the identified electronic design component. In some embodiments where the electronic design is backward traversed from the identified electronic design component, the direct fan-in electronic design components may be identified. These direct fan-in electronic design components may then be duplicated and interconnected according to the connectivity information in a copy of the electronic design.

CDC effects or CDC effect models may be used interchangeably and automatically injected into the electronic design based in part or in whole upon a set of one or more CDC rules, without human intervention. One or more checkers for verifying one or more properties of the copy of the electronic design may then be proved or disproved via verification (e.g., formal verification) or simulation (e.g., logic simulation). In some embodiments where a checker cannot be proved or disproved, the electronic design, the checker, and/or the property corresponding to the checker may be iteratively modified and re-verified. Proved or disproved properties may further be optionally added as helper properties to aid or help the remainder of the verification or simulation tasks for the electronic design or one or more other verification or simulation tasks for other electronic designs.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention.

Further, various embodiments encompass present and future known equivalents to the components referred to herein by way of illustration. It shall be further noted that the features and advantages described in the specification are not all inclusive and, in particular, many additional features and advantages will be apparent to one of ordinary skill in the art in view of the drawings, specification, and claims. Moreover, the language used in the specification has been principally selected for readability and instructional or explanatory purposes, and may not have been selected to delineate or circumscribe the inventive subject matter.

In various embodiments, various techniques described herein may be applied to electronic designs of various abstractions. For example, these techniques may be applied to a registered transfer level (RTL) electronic design or other abstractions during the early stage of the electronic design development cycle and receive an RTL model of an electronic design as an input and apply various techniques described herein to verify the RTL level electronic design by using circuit design component models of the RTL level electronic design. Various techniques described herein perform verification on an electronic design including one or more clock domain crossing paths subject to various forms of deviations in the timing, frequencies, amplitudes, phases, and/or periodicity of signals.

Various embodiments will now be described in detail with reference to the drawing figures. In one or more embodiments, FIG. 1A illustrates a high level block diagram for a system for verifying an electronic design with clock domain crossing paths and may comprise one or more computing systems 100, such as a general purpose computer including one or more micro-processors each having one or more processor cores described in the System Architecture Overview section to implement one or more special proposes. In some embodiments, the one or more computing systems 100 may invoke various system resources such as the processor(s) or processor core(s), memory, disks, etc. via its system bus and/or the external bus.

The one or more computing systems 100 may also initiate or interact with other computing systems (e.g., one or more other computing systems 100) via one or more networks to access various resources 128 that may comprise a floorplanner, a placement engine, a global routing engine, a channel routing engine, a conduit routing engine, and/or a detail routing engine 114, a layout editor and/or a schematic editor 116, a design rule checker 118, one or more sign-off and/or verification mechanisms 120, etc. The one or more computing systems 100 may further write to and read from, via an external bus architecture, a local or remote volatile or non-volatile computer accessible storage 160 that stores thereupon data or information such as, but not limited to, one or more databases (124) such as one or more schematic databases, one or more physical design databases, and/or electronic circuit design specification database(s), various statistics, various data, rule decks, various design rules, or constraints, etc. (122), and/or other information or data (126) that may be used to facilitate the performance of various functions to achieve the intended purposes.

In some embodiments, the one or more computing systems 100 may, either directly or indirectly through various resources 128, which reside on the system 100 or on one or more other computing systems, invoke a suite of mechanisms 152 including various software modules, hardware mechanisms, or combinations thereof that may comprises a one or more CDC identification mechanisms 102 to identify CDC paths and/or one or more related electronic design components, etc. The suite of mechanisms 152 may also include a proof acceleration mechanism 104 to identify, determine, or construct abstractions or abstract models for electronic design components to accelerate proof of properties or to assist verification tasks.

An abstraction or abstract model of an electronic design component include the required and/or desired circuit elements in view of one or more pertinent rules to render a verification task or proof of one or more properties involving the electronic design component more efficient and/or more accurate. For example, an abstraction or abstract model may function in tandem with one or more other mechanisms (e.g., the CDC injection mechanism 108, the duplication mechanism 110, the rule mechanism 112, etc.) to identify, determine, or construct an CDC effect model for an electronic design component of interest such that deviations (e.g., jitter in the clock signals) in the signals into or from the abstract model may be accommodated once the CDC effect model is injected into the electronic design.

The suite of mechanisms 152 may also comprise one or more design traversal mechanisms 106 to, either alone or in conjunction with one or more other mechanisms, identify and traverse a portion of an electronic design to identify electronic design components of interest. For example, the suite of mechanisms 152 may invoke a design traversal mechanism to identify and traverse a portion of an RTL (register transfer level) design to identify one or more electronic design components for CDC effect model injection.

The suite of mechanism 152 may include one or more CDC injection mechanisms 108 to inject one or more CDC effect models into an electronic design, one or more duplication mechanisms 110 to duplicate an electronic design component in an electronic design under verification. The suite of mechanisms 152 may also comprise a rule mechanism 112 that invokes one or more pertinent rules (e.g., CDC rules, design rules, etc.) to assist one or more other mechanisms in performing their respective functions. For example, a rule mechanism 112 may be invoked to function in conjunction with a design traversal mechanism 106 to traverse a portion of an electronic design and to identify electronic design components of interest as a candidate for CDC effect model injection and further in conjunction with a CDC injection mechanism 108 to inject a CDC effect model such that deviations in signals may be accommodated in verification tasks or proof of properties. In some embodiments, the rule mechanism 112 may include or function in conjunction with various properties (e.g., assertions, covers, constraints, assumes, etc.) that are transmitted into, for example, a verification engine to generate proven or disproven properties and/or to provide visualization, examples of proof, and/or counter-examples of proof of design behavior. These generated proven or disproven properties may then be further incorporated in the rule mechanism to aid subsequent verification tasks.

One of the advantages of the techniques described herein is that clock domain crossing paths may be automatically identified in an electronic design at early stages of the electronic design. For example, clock domain crossing paths may be automatically identified in an RTL level electronic design without human intervention and/or designer expertise and experiences.

Another advantage of the techniques is that the designers no longer need to decide or provide information for an electronic design automation tool to decide where or how to inject CDC effect models. Rather, these techniques described herein automatically determine whether CDC effect models are to be injected, what CDC effect models are to be injected, as well as how and where CDC effect models are to be injected in an electronic design without human intervention or designer expertise and/or experiences.

A derived advantage of these techniques is that proper CDC effects will be automatically accommodated and guesswork on the part of designers will be eliminated in verification flows that are neither overly optimistic nor overly pessimistic so that the computing system performing the verification tasks may save computation resources while achieving accurate coverage or verification results. This advantage is a direct consequence of the inclusion of correct CDC effect models at the correct locations of an electronic design such that no improperly injected CDC effect models (e.g., incorrect CDC effect models, incorrect locations of injection, etc.) may cost the computing system extra resources while obtaining inferior verification or coverage results.

Another advantage of these techniques is that for electronic design verification, a designer no longer needs to set up a different verification environment to consider CDC effects including deviations in signals in the electronic design. Rather, the designer may use the same verification environment flow and perform the verification as if no CDC effects are to be considered in the verification flow with the techniques described herein. Other advantages of these techniques will become self-evident in view of the description of FIGS. 1B-4B below.

Figure 4A:
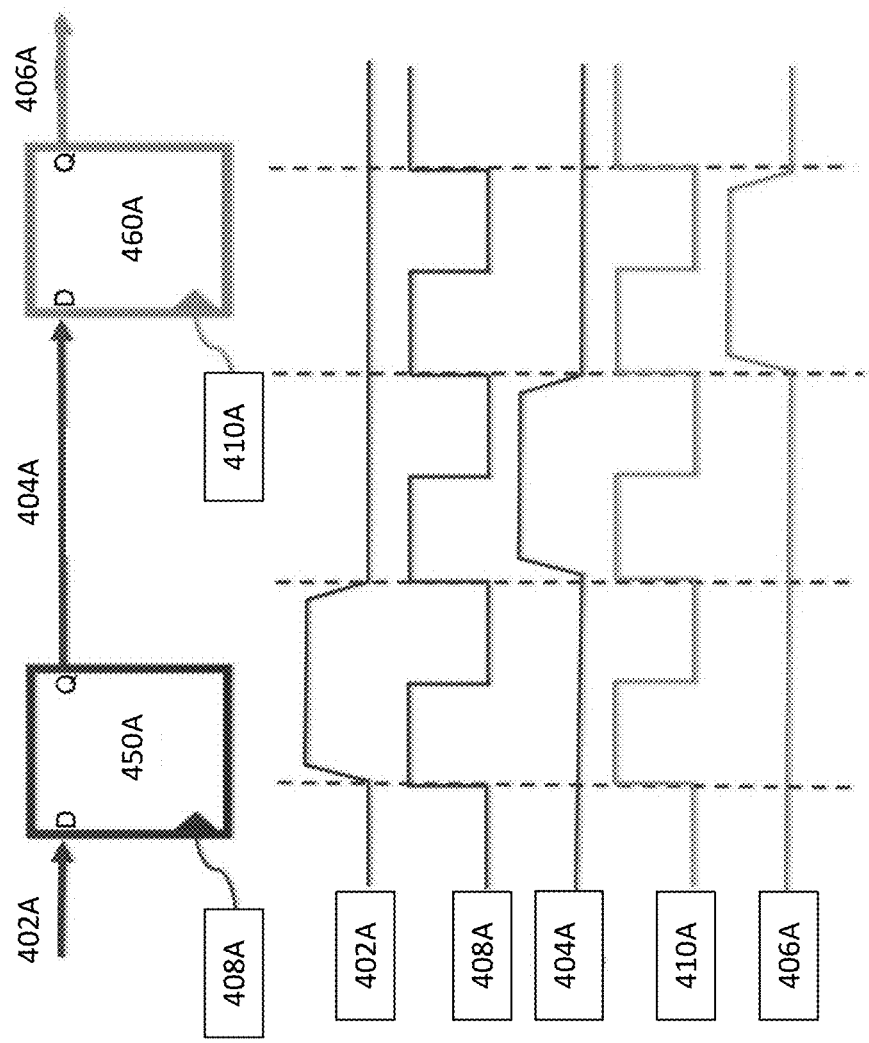
FIG. 4A illustrates a simplified portion of an electronic design including a clock domain crossing path and the corresponding signals in one or more embodiments.
Figure 4B:
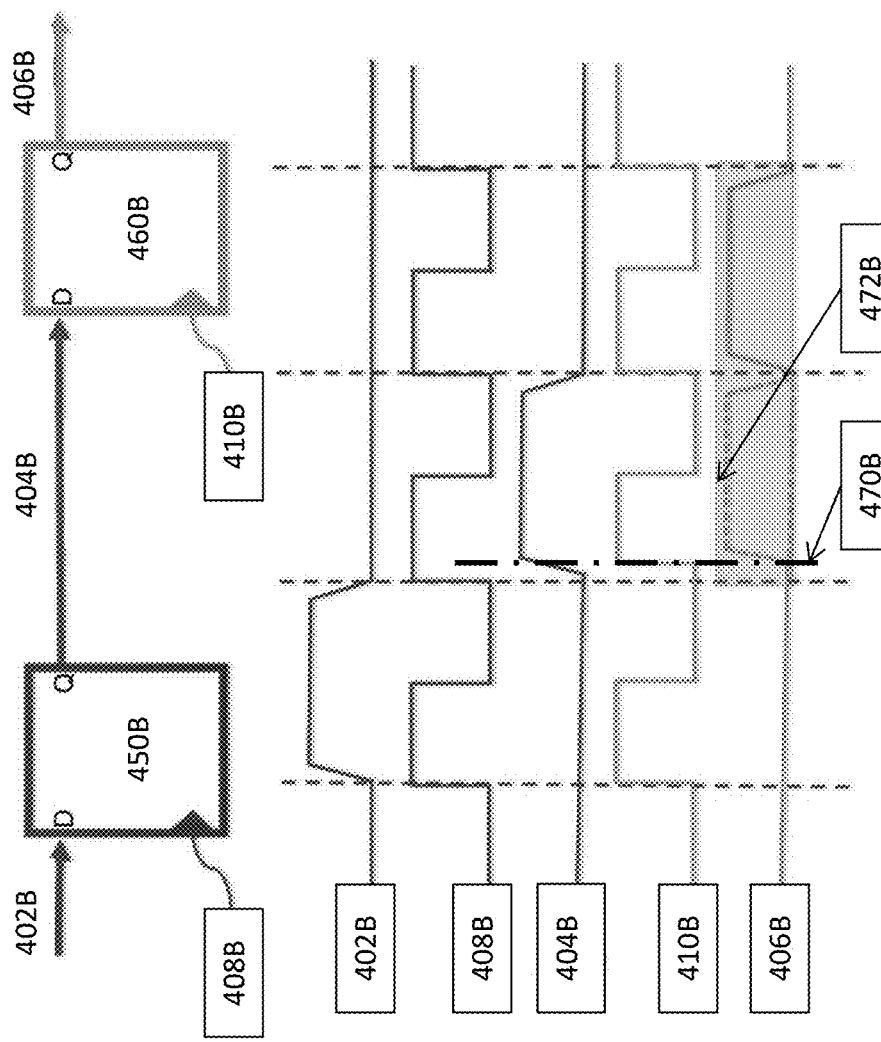
FIG. 4B illustrates the simplified portion of the electronic design including the clock domain crossing path illustrated in FIG. 4A and the corresponding signals with negative jitter in the clock domain crossing path in one or more embodiments.

FIGS. 4A-B jointly illustrate an example of jitter effects. FIG. 4A illustrates a simplified portion of an electronic design including a clock domain crossing path and the corresponding signals in one or more embodiments. More specifically, FIG. 4A illustrates a portion of a simplified electronic design including the first flip-flop 450A belong to the first clock domain and connected to the second flip-flop 460A via path 404A. The first flip-flop 450A receives an input signal 402A and generates an output via path 404A that is propagated to the input of the second flip-flop 460A which belongs to the second clock domain and generates the output via the path 406A. FIG. 4A further illustrates ideal signals including the input signal 402A, the first clock signal 408A, and the output signal via path 404A of the first flip-flop 450A as well as the ideal signals including the input signal (the output signal of flip-flop 450A via path 404A), the second clock signal 410A, and the output signal via the path 406A.

FIG. 4B illustrates the simplified portion of the electronic design including the clock domain crossing path illustrated in FIG. 4A and the corresponding signals with negative jitter in the clock domain crossing path in one or more embodiments. More specifically, FIG. 4B illustrates a portion of a simplified electronic design including the first flip-flop 450B belong to the first clock domain and connected to the second flip-flop 460B via path 404B. The first flip-flop 450B receives an input signal 402B and generates an output via the path 404B that is propagated to the input of the second flip-flop 460B which belongs to the second clock domain and generates the output via the path 406B.

FIG. 4B further illustrates the signals including the input signal 402B, the first clock signal 408B, and the output signal via the path 404B of the first flip-flop 450B as well as the signals including the input signal via the path 404B (the output signal of the first flip-flop 450B), the second clock signal 410B, and the output signal via the path 406B. In FIG. 4B, there is negative jitter (indicated by 470B) present on the second clock signal 410B to the first clock signal 408B. A flip-flop has the minimum required values for the setup time ($T_{SU}$, the amount of time the data signal should remain stable before the clock event) and hold time ($T_H$, the amount of time the data signal should remain stable after the clock event), and the data signal should remain stable for the setup time and the hold time so that the data signal may be reliably sampled.

This negative jitter may thus cause a meta-stable value or state in the electronic design, and therefore the output signal 472B indicated in dashed lines may have a high value (or "1") or a low value or state (or "0") due to the meta-stability caused by the negative jitter. Various techniques described above may effectively verify an electronic design by automatically injecting CDC effect models and based on the verification result, either modify the electronic design or modify the checkers to ensure that the electronic design conforms to the specification while accounting CDC effects due to meta-stability in the signals caused by the multiple clock domains in the electronic design.

Figure 1B:
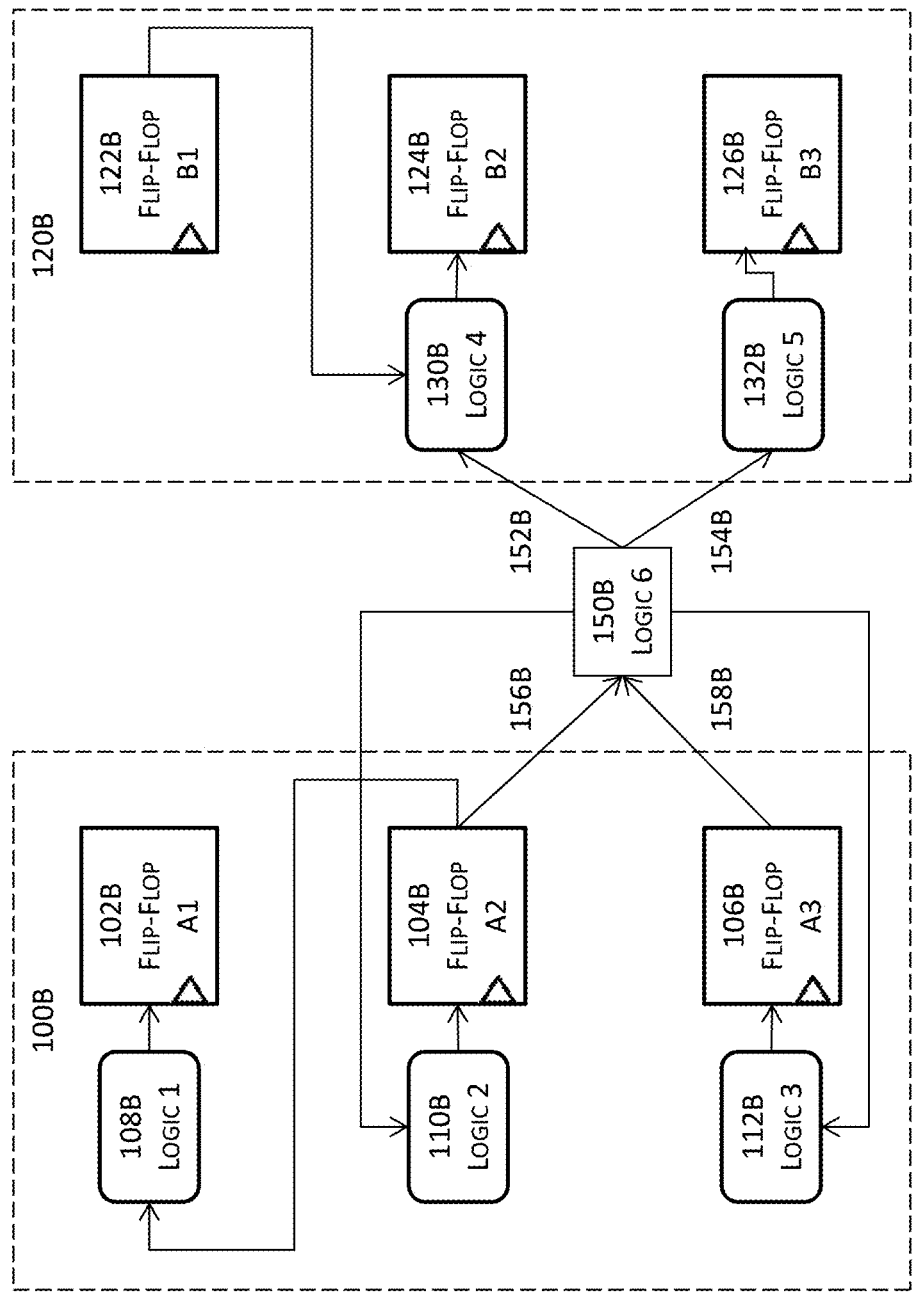
FIG. 1B illustrates an example of a simplified electronic design including clock domain crossing paths for the purpose of explanation and illustration of the application of certain techniques described herein in one or more embodiments.

FIG. 1B illustrates an example of a portion of a simplified electronic design including clock domain crossing paths for the purpose of explanation and illustration of the application of certain techniques described herein in one or more embodiments. More specifically, the portion of the simplified electronic design includes the first block of electronic design components 100B and the second block of electronic design components 120B interconnected to the first block via a logic element 150B (logic 6). In this simplified electronic design, the electronic design components in the first block 100B and the logic element 150B belong to the first clock domain; and the electronic design components in the second block 120B belong to the second clock domain. The first block 100B includes three flip-flops, 102B, 104B, and 106B as well as three logic elements, 108B, 110B, and 112B that belong to the same first clock domain, and thus the interconnections between these components are not considered clock domain crossing paths.

Flip-flop A1 (102B) receives input from logic element 108B (logic 1); flip-flop A2 (104B) receives input from logic element 110B (logic 2); and flip-flop A3 (106B) receives input from logic element 112B (logic 3). The output of flip-flop 104B is transmitted via path 156B to the input of logic element 108B whose output is further transmitted to the input of flip-flop 102B. The output of flip-flop 104B and the output of flip-flop 106B are further transmitted via path 158B to logic element 150B (logic 6) belonging to the first clock domain. The output of logic element 150B (logic 6) is transmitted to the respective inputs of logic elements 110B and 112B. The various paths in the first block 100B and between the flip-flops (e.g., 104B and 106B) in the first block 100B belong to the same first clock domain and are thus not clock domain crossing paths. The second block 120B includes flip-flop 122B (flip-flop B1) whose output is transmitted to the input of logic element 130B (logic 4). In this example illustrated in FIG. 1B, the circuit components in the second block 120B belong to the same clock domain, and thus the interconnections between these circuit components, 122B, 130B, 124B, 132B, and 126B, are not considered clock-domain crossing paths.

In addition to the output of flip-flop 122B, logic element 130B also receives the output from logic element 150B via path 152B. The output of logic element 130B is transmitted to the input of flip-flop 124B (flip-flop B2). The output of logic element 150B (logic 6) is also transmitted to logic element 132B (logic 5) whose output is further transmitted to flip-flop 126B (flip-flop B3). The paths in the second block 120B belong to the second clock domain whereas logic element 150B belongs to the first clock domain. The simplified electronic design illustrated in FIG. 1B includes four clock domain crossing paths that may be automatically identified with, for example, the CDC identification mechanism 102 either alone or in tandem with one or more other mechanisms (e.g., the design traversal mechanism 106 that traverses the electronic design). For example, the CDC identification mechanism 102 may identify these four CDC paths by traversing the simplified electronic design—the path from flip-flop 104B via 156B to logic element 150B and further via path 152B to logic element 130B; the path from flip-flop 104B via path 156B to logic element 150B and further via path 154B to logic element 132B; the path from flip-flop 106B via 158B to logic element 150B and further via path 152B to logic element 130B; and the path from flip-flop 106B via 158B to logic element 150B and further via path 154B to logic element 132B.

For these four CDC paths in the simplified electronic design, the CDC injection mechanism 108 may inject CDC effect models separately for each of the four CDC paths because each of these four paths may be different in lengths and electronic design components interconnected and thus need to be considered separately in some embodiments. In determining where to inject CDC effect models to capture CDC effects, a rule mechanism (e.g., 112 of FIG. 1) and one or more rules (e.g., one or more CDC rules in 122 of FIG. 1) may be invoked and used to rule out injecting a CDC effect model on flip-flop 102B and 104B (e.g., at the output of 102B or 104B) because otherwise the injected CDC effect model may erroneously impact on the logic of logic elements 108B, 110B, or 112B.

The rule mechanism may rule out such injections because the logic elements 108B, 110B, and 112B belong to the same clock domain and thus will not become out-of-synchronization due to CDC effects and further because the outputs (e.g., outputs of 104B and 106B) are transmitted to logic element 150B or flip-flop 102B. The rule mechanism may further rule out such injections (on 102B or 104B) because such insertions cannot distinguish the CDC effects from flip-flop 104B to flip-flop 124B and from flip-flop 104B to flip-flop 126B. These two CDC paths (104B→124B and 104B→126B) may be different in lengths and/or interconnected electronic design components and may thus be out-of-synchronization separately to exhibit different CDC effects.

The rule mechanism may also invoke one or more CDC rules to rule out injections of CDC effect models on the input of flip-slop 124B because the CDC identification mechanism and/or the design traversal mechanism may identify that flip-flop 124B receives input from flip-flop 122B. That is, the output of flip-flop 122B will be considered with the CDC effect if a CDC effect model is injected at the input of flip-flop 124B. The rule mechanism may rule out such an injection candidate because flip-flops 122B and 124B belong to the same second clock domain and will not become out-of-synchronization due to CDC effects. The rule mechanism may also rule out injection of a CDC effect model at the input of flip-flop 124B because the CDC effects from two CDC paths, 156B→152B and 158B→152B, cannot be distinguished with the injection of a CDC effect model at the input of flip-flop 124B. Similarly, the rule mechanism may also invoke one or more CDC rules to rule out injection of a CDC effect model at flip-flop 126B because the CDC effects from two CDC paths, 156B→154B and 158B→154B, cannot be distinguished with the injection of a CDC effect model at the input of flip-flop 126B.

The rule mechanism may also invoke one or more CDC rules to rule out injection of a CDC effect model along path 152B between logic element 150B and logic element 130B because the CDC effects from two CDC paths, 156B→152B and 158B→152B, cannot be distinguished with the injection of a CDC effect model along path 152B. That is, the rule mechanism may rule out injecting a CDC effect model along path 152B because such an injection fails to consider the possible scenario where the two CDC paths, 156B→152B and 158B→152B, may be separately out-of-synchronization due to CDC effects.

Similarly, the rule mechanism may also invoke one or more CDC rules to rule out injection of a CDC effect model along path 154B between logic element 150B and logic element 132B because the CDC effects from two CDC paths, 156B→154B and 158B→154B, cannot be distinguished with the injection of a CDC effect model along path 154B. That is, the rule mechanism may rule out injecting a CDC effect model along path 154B because such an injection fails to consider the possible scenario where the two CDC paths, 156B→154B and 158B→154B, may be separately out-of-synchronization due to CDC effects. In this example of simplified electronic design, FIG. 1B illustrates the application of rules (e.g., CDC rules) by one or more mechanisms to determine whether or not certain locations or paths may constitute appropriate candidates for CDC effect model injection.

Figure 1C:
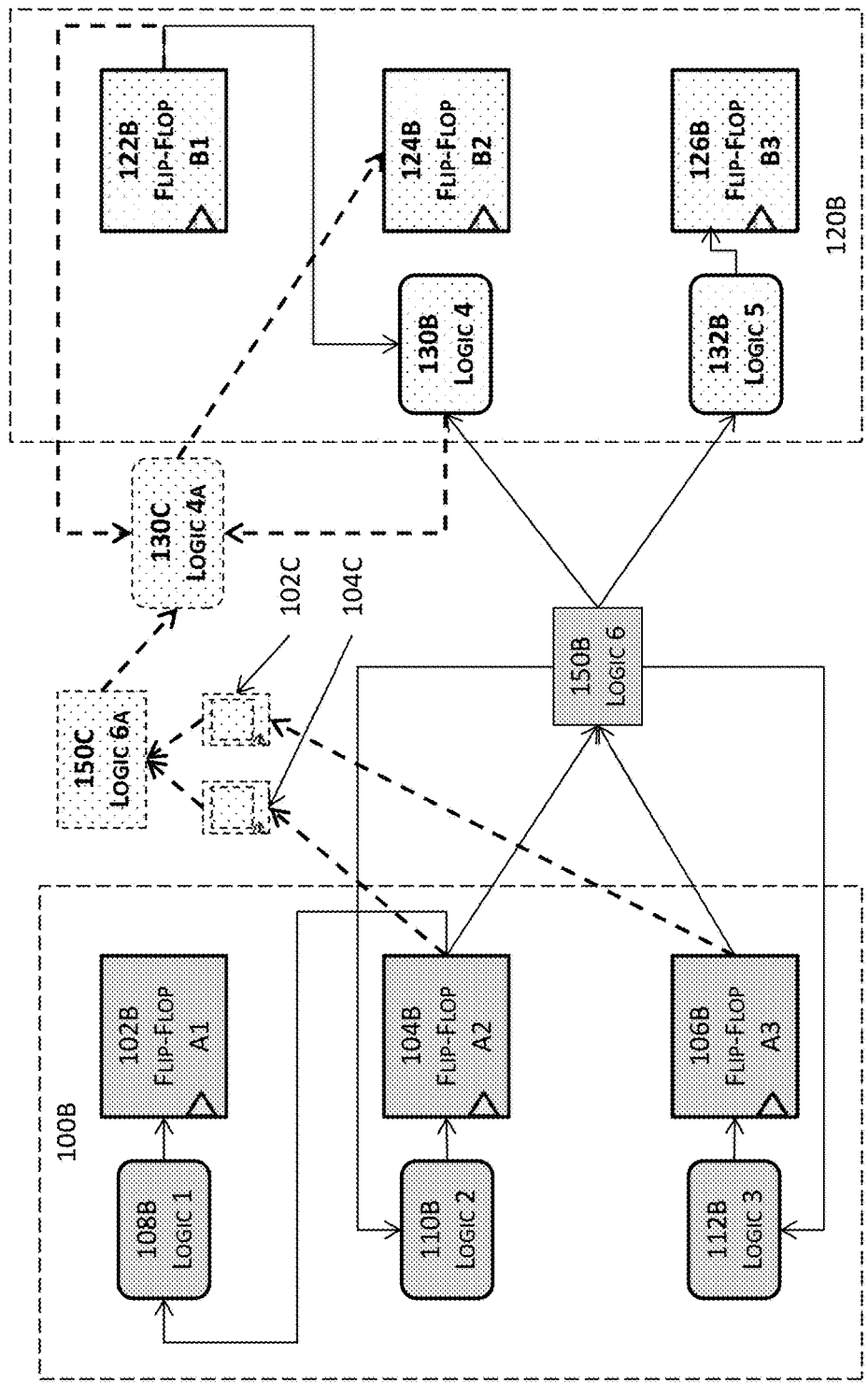
FIG. 1C illustrates the application of certain techniques described herein to the example of the simplified electronic design including clock domain crossing paths illustrated in FIG. 1B in one or more embodiments.

FIG. 1C illustrates the application of certain techniques described herein to the example of the simplified electronic design including clock domain crossing paths illustrated in FIG. 1B in one or more embodiments. In these embodiments, a destination flip-flop (e.g., flip-flop 124B) may be identified by, for example, a CDC identification mechanism and/or a design traversal mechanism. The design traversal mechanism and the CDC identification mechanism may further function in tandem to identify the direct fan-in electronic design components for the identified flip-flop 124B when traversing the electronic design backward from the identified flip-flop 124B.

In the example illustrated in FIG. 1C, the direct fan-in electronic design components may include logic element 150B and logic element 130B. In some these embodiments illustrated in FIGS. 1B-D, a logic element may include combinational logic or time-independent logic, certain Boolean circuits, etc. In some embodiments, a logic element does not include any memory element so its output depends only on the present value or state of its input signals, rather than on a sequence of prior inputs. In some embodiments where the design traversal mechanism forward traverses the electronic design from the identified electronic design component, the direct fan-out electronic design components, rather than the direct fan-in electronic design components, for the identified electronic design component may be identified.

A design duplication mechanism may be invoked to duplicate the direct fan-in electronic design components. In the example illustrated in FIG. 1C, the design duplication mechanism duplicates logic element 150B and logic element 130B and creates the duplicated logic element 150C and logic element 130C. The design duplication mechanism may further interconnect the original logic element 130B to the duplicated logic element 130C and the output of the duplicated logic element 130C to flip-flop 124B while removing the connection between the original logic element 130B and flip-flop 124B. The design duplication mechanism may further interconnect flip-flop 104B and flip-flop 106B to the duplicated logic element 150C.

A CDC injection mechanism may also be invoked to inject two separate CDC effect models 102C and 104C along the two newly created paths between flip-flops 104B and 106B and the duplicated logic element 150C. With the duplication of the direct fan-in electronic design components, the re-routing of the electronic design to accommodate the duplicated electronic design components, and the injection of these two CDC effect models, the CDC effects for the clock domain crossing paths (the path between flip-flop 104B and logic element 130B and the path between flip-flop 106B and logic element 130B) may be accurately considered during verification without impacting the remaining portion of the electronic design or compromising possible CDC effects.

In some embodiments, these mechanisms use an in-memory representation or a copy of the electronic design for duplication and re-routing such that the original electronic design is not modified. In some of these embodiments, the in-memory representation or the copy of the electronic design is hidden from and not presented to the designer. Rather, the original electronic design without the duplicated electronic design components and interconnections which are used by various mechanisms described herein for performing their respective functions.

Figure 1D:
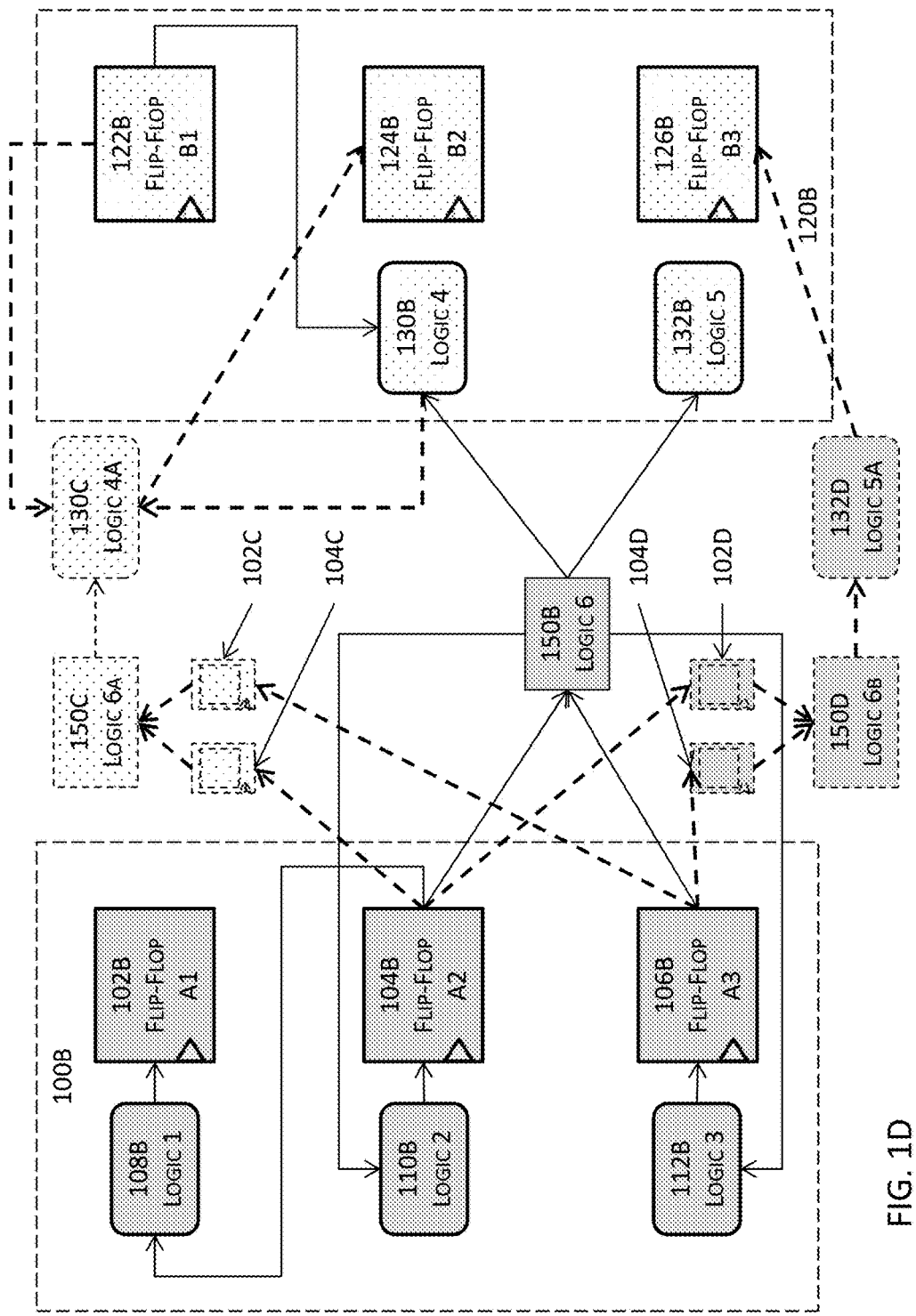
FIG. 1D illustrates further application of certain techniques described herein to the example of the simplified electronic design including clock domain crossing paths illustrated in FIGS. 1B-C in one or more embodiments.

FIG. 1D illustrates further application of certain techniques described herein to the example of the simplified electronic design including clock domain crossing paths illustrated in FIGS. 1B-C in one or more embodiments. In these embodiments, another destination flip-flop (e.g., flip-flop 126B) may be identified by, for example, a CDC identification mechanism and/or a design traversal mechanism. The design traversal mechanism and the CDC identification mechanism may further function in tandem to identify the direct fan-in electronic design components for the identified flip-flop 126B. In the example illustrated in FIG. 1D, the direct fan-in electronic design components may include logic element 150B and logic element 132B. The design duplication mechanism may further interconnect the flip-flops 104B and 106B and the duplicated logic element 150D which is further interconnected with logic element 132D (logic 5A). The design duplication mechanism may also interconnect the duplicated logic element 132D and flip-flop 126B to finish the interconnection for these duplicated electronic design components.

A CDC injection mechanism may also be invoked to inject two separate CDC effect models 102D and 104D along the two newly created paths between flip-flops 104B and 106B and the duplicated logic element 150D. With the duplication of the direct fan-in electronic design components, the re-routing of the electronic design to accommodate the duplicated electronic design components, and the injection of these two CDC effect models, the CDC effects for the clock domain crossing paths (the path between flip-flop 104B and logic element 132B and the path between flip-flop 106B and logic element 132B) may be accurately considered during verification without impacting the remaining portion of the electronic design or compromising possible CDC effects. In addition, with the duplication of electronic design components and injection of CDC effect models, every possible CDC path in the simplified electronic design has a CDC effect model injected, and the injected CDC effect models do not impact non-CDC paths.

Figure 2A:
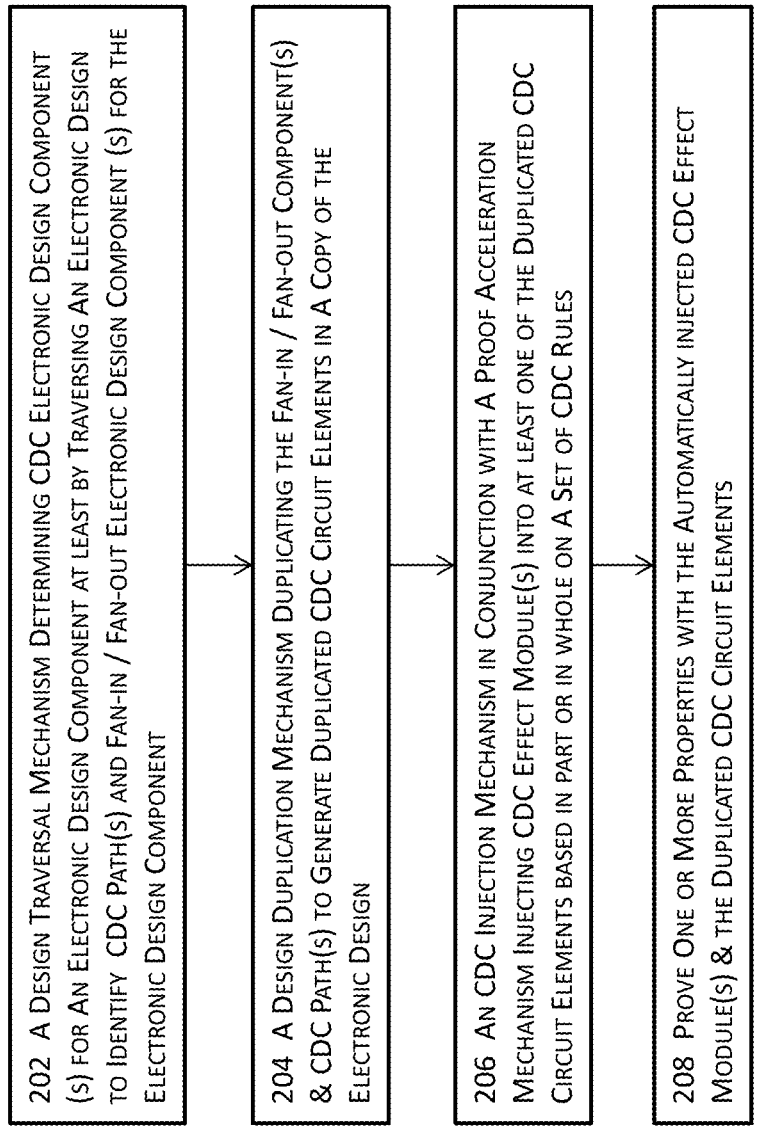
FIG. 2A illustrates a high level block diagram for a method or system for verifying an electronic design with clock domain crossing paths in one or more embodiments.

FIG. 2A illustrates a high level block diagram for a method or system for verifying an electronic design with clock domain crossing paths in one or more embodiments. In these embodiments illustrated in FIG. 2A, a design traversal mechanism may first determine one or more CDC circuit components for a circuit component by identifying an electronic design component, traversing the electronic design starting from the identified electronic design component, and identifying one or more CDC paths at 202. For example, the design traversal mechanism may identify a flip-flop or a sequential logic component as the identified electronic design component, traverse a portion of the electronic design from the identified electronic design component, and identify one or more CDC paths at 202. In some embodiments, the design traversal mechanism may identify a destination electronic design component whose output is time-dependent and traverse the electronic design backward from the destination electronic design component. In some other embodiments, a source electronic design component may be identified for forward traversal of the electronic design from the source electronic design component.

In some of these embodiments illustrated in FIG. 2A, the direct fan-in electronic design components may also be identified for the identified electronic design component at 202 where the design traversal mechanism backward traverses the electronic design from the identified electronic design component. In some other embodiments where the design traversal mechanism forward traverses the electronic design from the identified electronic design component (e.g., a source flip-flop or register associated with a CDC path), the direct fan-out electronic design components for the identified electronic design component may be identified.

In addition or in the alternative, time-independent electronic design components (e.g., combinational logic components, etc.) may be grouped into one or more groups or blocks (e.g., logic elements 108B, 110B, 112B, 130B, 132B, 150B, etc. of FIG. 1B) and/or isolated from time-dependent electronic circuit components from which the circuit component may be identified. The direct fan-in electronic design components for the identified electronic design component may include, for example, one or more electronic design components whose output may be transmitted to the identified electronic design component in some embodiments.

In some embodiments where the electronic design component and its direct fan-in electronic design components have been identified at 202, the design traversal mechanism may further identify one or more additional electronic design components whose inputs or outputs may be transmitted to or from the direct fan-in electronic design components. These one or more additional electronic design components may be identified for subsequent interconnection with duplicated direct fan-in electronic design components for the identified electronic design component or for CDC effect model injection. In some embodiments, various mechanisms (e.g., the design duplication mechanism, the CDC injection mechanism, etc.) may execute the following examples of commands that duplicate electronic design components and to inject CDC effects into an electronic design.

```
clock-domain
(-signal_list<clocking_signal_list>[-
    target_domain<domain_ID>]
|-list
|-clear)
abstract-cdc [-task<task_name>]
((-inject<flop_name>[-no_prop])
    |(-reg<flop_name>[-type (src|dst)]
        [-pos_jitter (on|off)]
        [-neg_jitter (on|off)]
        [-auto_prop (on|off)]
    |-find [-coi] [-silent]
    |-list [-silent]
    |-info<reg_name>[-silent]
    |-remove<signal>+
    )
)
```

In the aforementioned examples of commands, "clock-domain" specifies a specific clock domain with the listing of signals and the target domain identification for the signals. "abstract-cdc [-task<task_name>]" may be executed for design duplication and CDC injection. Furthermore, the aforementioned "clock-domain" command provides greater flexibility for designers to specify, configure, or adjust clock domains to aid the automatic duplication of electronic design components, to explore or experiment with different CDC configurations, and/or to more accurately gather or generate results.

In the example illustrated in FIG. 1C, the design traversal mechanism may either alone or in tandem with one or more other mechanisms (e.g., the CDC identification mechanism 102 of FIG. 1A) to identify flip-flop 124B as the identified electronic design component, traverse the electronic design from flip-flop 124B, and identify the CDC paths 156B→152B and 158B→152B as well as its direct fan-in circuit components including logic elements 130B and 150B. In some embodiments, one or more additional electronic design components including flip-flop 104B, 106B, and 122B may also be identified for various mechanisms to inject one or more CDC effect models or to interconnect duplicated direct fan-in electronic design components.

The design traversal mechanism may further identify flip-flop 126B as the identified electronic design component and traverse the electronic design backward at 202. The CDC paths 156B→154B and 158B→154B as well as the direct fan-in electronic design components 150B and 132B may be identified at 202. At 204, the duplication mechanism may be invoked to duplicate the identified direct fan-in electronic design component. In some embodiments, these mechanisms use an in-memory representation or a copy of the electronic design for duplication and re-routing such that the original electronic design is not modified. In some of these embodiments, the in-memory representation or the copy of the electronic design is hidden from and not presented to the designer. Rather, the original electronic design without the duplicated electronic design components and interconnections which are used by various mechanisms described herein for performing their respective functions.

In the example illustrated in FIG. 1C, the direct fan-in electronic design components 150B and 130B are respectively duplicated as logic element 150C and logic element 130C at 204. The design duplication mechanism may interconnect the identified, additional electronic design components 122B, 104B, and 106B with the duplicated direct fan-in electronic design components 150C and 130C and remove the connection between the direct fan-in electronic design component 130B and the identified electronic design component 124B in the manner as illustrated in FIG. 1C. In the example illustrated in FIG. 1D, the direct fan-in electronic design components 150B and 132B are also respectively duplicated as logic element 150D and logic element 132D at 204. The design duplication mechanism may interconnect the identified, additional electronic design components 104B and 106B with the duplicated direct fan-in electronic design components 150D and 132D and remove the connection between the direct fan-in electronic design component 132B and the identified electronic design component 126B in the manner as illustrated in FIG. 1D.

At 206, the CDC injection mechanism may, either alone or in conjunction with one or more other mechanisms (e.g., the rule mechanism, the CDC identification mechanism, etc.) identify the CDC path segments for injecting CDC effect models and then inject CDC effect models for each of the identified CDC path segments. In the example illustrated in FIG. 1D, the CDC injection mechanism may inject a CDC effect model along the CDC path segment between flip-flop 104B and the duplicated logic element 150D as well as another CDC effect model along the CDC path segment between flip-flop 106B and the duplicated logic element 150D for the identified electronic design component 126B. In this particular example, the CDC path segment between logic element and the CDC path segment between logic element 150D and logic element 132D are determined not to constitute the candidates for CDC model injection by the operation of the rule mechanism for substantially similar or identical reasons provided in the description of FIG. 1B above.

At 208, one or more verification engines or mechanisms that include or function in tandem with one or more microprocessors of one or more electronic design automation systems (e.g., computing system 100 of FIG. 1A) may be invoked to verify the electronic design by, for example, proving or disproving one or more properties.

Figure 2B:
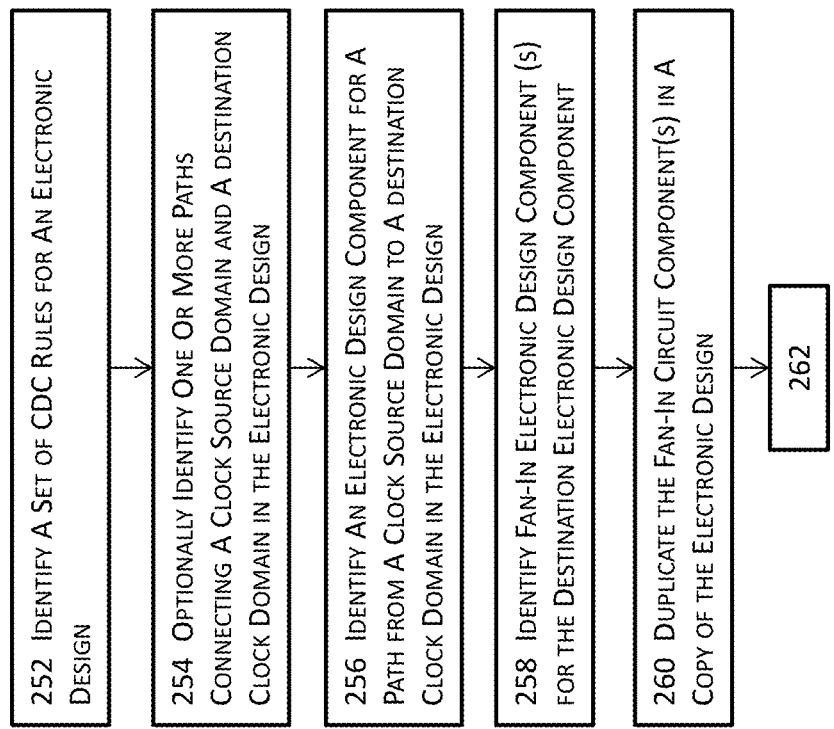
FIGS. 2B-C jointly illustrate a more detailed block diagram for a method or system for verifying an electronic design with clock domain crossing paths in one or more embodiments.
Figure 2C:
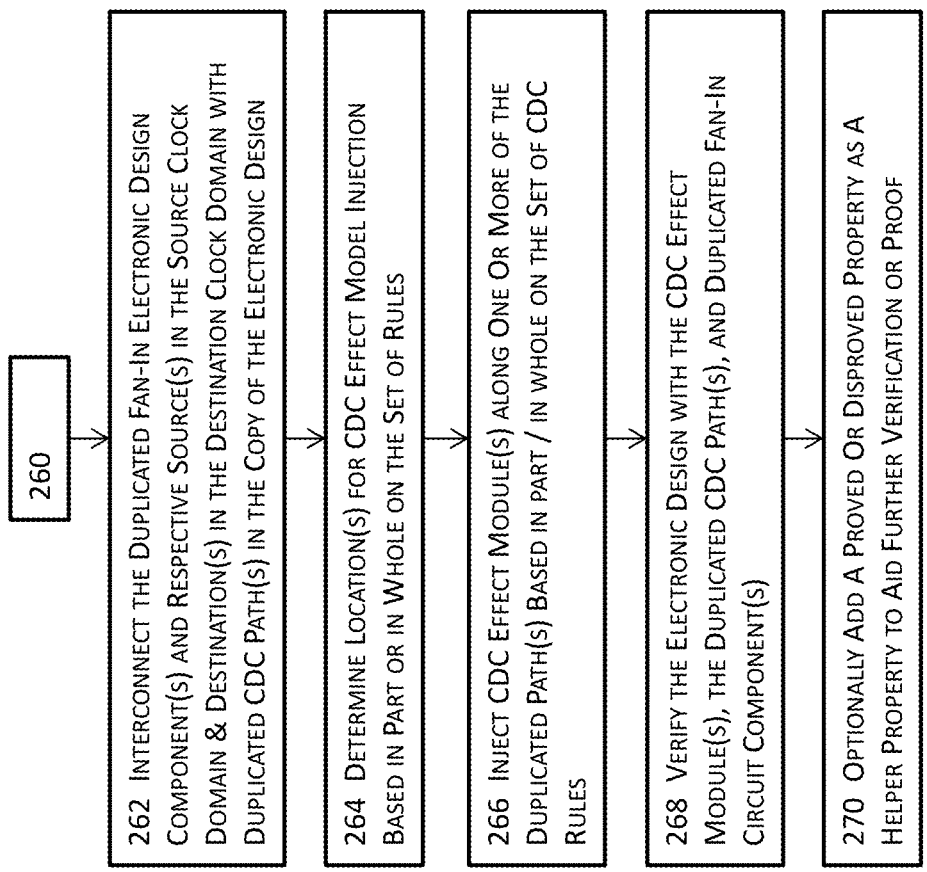

FIGS. 2B-C jointly illustrate a more detailed block diagram for a method or system for verifying an electronic design with clock domain crossing paths in one or more embodiments. In these embodiments illustrated in FIGS. 2B-C, a set of rules including one or more CDC rules may be identified at 252. More details about the rule mechanism and some examples of CDC rules are described below with reference to FIGS. 2D-G. Various mechanisms may optionally identify time-dependent electronic design components (e.g., sequential logic, flip-flops, hardware registers, processor registers, etc.) that may be susceptible to variations or deviations in, for example, timing, frequencies, amplitudes, phases, and/or periodicity of signals in some embodiments.

In some of these embodiments, time-independent electronic design components (e.g., combinational logic, etc.) may also be identified and grouped into one or more blocks of electronic design components, and each of these one or more blocks may be manipulated independently or individually. For example, a block of time-independent electronic design components may be duplicated as an instance and interconnected accordingly. In addition or in the alternative, one or more clock domain crossing (CDC) paths may be identified at 254. For example, a design traversal mechanism may traverse an electronic design by using connectivity information and/or other timing related information to identify these one or more CDC paths at least in the portion of interest of the electronic design. The connectivity information and the timing related information may include how one electronic design component is connected to another electronic design component, the relevant port information, one or more nets or net segments interconnecting these two electronic design components, the clock domain information associated with these two electronic design components, etc.

An electronic design component may be identified for a CDC path at 256. For example, a CDC identification mechanism may identify a destination, time-dependent electronic design component as the identified electronic design component at 256 in some embodiments. In these embodiments, the design traversal mechanism may be invoked and instructed to backward traverse the electronic design from the identified destination electronic design component. In some other embodiments, a source, time-dependent electronic design component may be identified at 256, and the design traversal mechanism may be invoked or instructed to forward traverse the electronic design from the source electronic design component. It shall be noted that the time-dependent and/or the time-independent electronic design components may or may not necessarily be identified first at 254 for various techniques to perform their intended functions.

For example, a design traversal mechanism may traverse from an electronic design component and identify the appropriate electronic design component (e.g., the first time-dependent electronic design component connected to a CDC path) at 256 in some embodiments even when no CDC paths, other time-dependent electronic design components, or time-independent electronic design components have been identified at 254. In these embodiments, the design traversal mechanism may identify the electronic design component, traverse the electronic design from the identified electronic design component, and identify or determine relevant information (e.g., clock domain, whether or not a path constitutes a CDC path, etc.) as the electronic design is being traversed.

Once the electronic design component is identified at 256, one or more direct fan-in electronic design components may be identified at 258 by, for example, the CDC identification mechanism functioning in tandem with, for example, the design traversal mechanism. In the example provided in FIG. 1C, flip-flop 124B is first identified as being connected to a CDC path; the design traversal is instructed to traverse the electronic design from 124B backward; and the direct fan-in electronic design components 130B and 150B are identified because of their time-independent nature of being combinational logic elements.

At 260, the identified direct-fan in electronic design components for the identified electronic design component may be duplicated. For example, a design duplication mechanism may be invoked to duplicate these one or more direct fan-in electronic design components in a copy of the electronic design (e.g., an in-memory view, copy, or representation of the electronic design). The designer or verification engineer may or may not see this copy of the electronic design including the duplicated direct fan-in electronic design components. Rather, the designer or verification engineer may still see the same, original electronic design that does not include the duplicated electronic design components.

In these embodiments, all the identification of CDC electronic design components and paths, duplication of electronic design components, interconnections for the duplicated electronic design components occur in the background without tempering with the original design so that the designer or verification engineer see what the actual electronic design contains. Another advantage of maintaining the copy including the duplicated electronic design components in memory is not to disturb the original electronic design to avoid inadvertent modifications of the original electronic design.

At 262, the duplicated electronic design components may be interconnected with the corresponding electronic design components while the original interconnection between the identified electronic design component and one of the direct fan-in electronic design components may be removed in the copy of the electronic design based in part or in whole upon the set of rules identified at 252. In the example provided in FIG. 1C, the combinational logic elements 130B and 150B are respectively duplicated as 130C and 150C. These two duplicated combinational logic elements may then be interconnected according to the connectivity of the original combinational logic elements 130B and 150B. Moreover, the interconnection between the original combinational logic element 130B and flip-flop 124B is removed in the copy of the electronic design while the original combinational logic element 130B is further interconnected to the duplicated logic element 130C which is further interconnected to flip-flop 124B to complete the interconnections.

At 264, the CDC injection mechanism may determine a location for injecting a CDC effect model in conjunction with the rule mechanism based in whole or in part the set of one or more rules identified at 252. In some embodiments, a CDC effect model may be injected along a CDC path segment for each identified CDC path. More details about the rules for CDC effect model injection will be described in subsequent paragraphs with reference to FIGS. 2D-G below.

At 266, a CDC effect model may be injected along an identified CDC path or path segment by using the CDC injection mechanism in conjunction with the rule mechanism which references the set of one or more rules identified at 252 to determine the appropriate CDC path or CDC path segment for CDC effect model injection. In the example provided in FIG. 1D, a CDC effect model is injected along the CDC path segment connecting flip-flop 106B and the duplicated combinational logic element 150D, and another CDC effect model is injected along the CDC path segment connecting flip-flop 104B and the duplicated combinational logic element 150D for the identified electronic design component 126B (flip-flop B3). In the example provided in FIG. 1C, a CDC effect model is injected along the CDC path segment connecting flip-flop 106B and the duplicated combinational logic element 150C, and another CDC effect model is injected along the CDC path segment connecting flip-flop 104B and the duplicated combinational logic element 150C for the identified electronic design component 124B (flip-flop B2).

At 268, a verification mechanism may be invoked to perform verification on the copy of the electronic design that is created at 260 and includes the injected CDC effect models, the duplicated fan-in electronic design components, re-routed interconnections. At 270, a property that has been proved or disproved may be added as a helper property that may be used to aid the current verification task or subsequent verification tasks. A helper property includes a proved or disproved property that indicates forward property of a payload or reachable or unreachable states and may be used to help or aid the proof or disproof of one or more other properties.

Figure 2D:
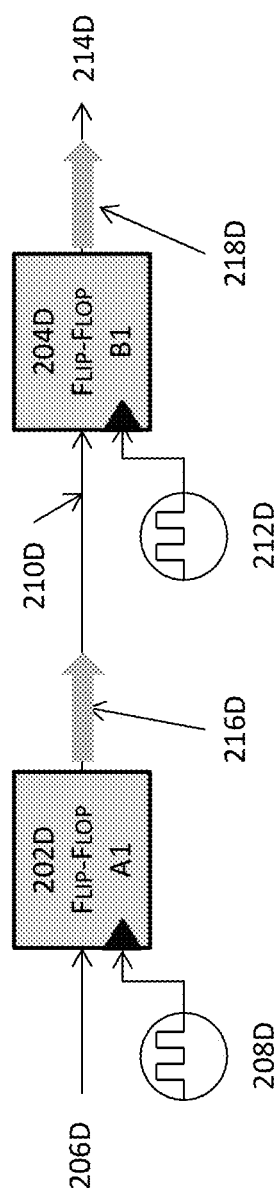
FIG. 2D illustrates some examples of CDC injection rules that may be used in injecting one or more CDC effect modules into a simplified portion of an electronic design having one or more clock domain crossing paths in one or more embodiments.

FIG. 2D illustrates some examples of CDC injection rules that may be used in injecting one or more CDC effect modules into a simplified portion of an electronic design having one or more clock domain crossing paths in one or more embodiments. More specifically, FIG. 2D illustrates a portion of a simplified electronic design including the first flip-flop 202D in the first clock domain 208D and the second flip-flop 204D in the second clock domain 212D. The first flip-flop 202D and the second flip-flop 204D are interconnected with the path 210D, which is a CDC path because the first and second flip-flops belong to two different clock domains. The first flip-flop receives an input signal from 206D and issues the output signal to path 210D which is connected to the input of the second flip-flop 204D which in turn issues its output to 214D.

A CDC rule for the simplified electronic design illustrated in FIG. 2D may include the application of a meta-stable signal value or state to the output of flip-flop 202D or the CDC signal propagating along the CDC path 210D. Alternatively, the CDC rule for the simplified electronic design illustrated in FIG. 2D may include the application of a meta-stable signal value or state to the output of flip-flop 204D or the CDC signal propagating along the CDC path 214D. In this particular example, either injecting the CDC effect model 216D that incorporates the application of a meta-stable state or value at the output of flip-flop 202D or another CDC effect model 218D that incorporates the application of a meta-stable state or value at the output of flip-flop 204D may capture the CDC effect of flip-flops 202D and 204D being out of synchronization.

In some embodiments, a meta-stable signal or meta-stability includes the scenario when there are setup time violations and/or hold time violations in a flip-flop, the flip-flop may enter a state where its output is unpredictable. That is, the flip-flop may enter a meta-stable state or a quasi-stable state with its output possibly oscillating between the high state and the low state. Meta-stability may also include the scenario where two inputs (e.g., data and clock or clock and reset) are switching at about the same time so that the output may behave unpredictably and may oscillate multiple times and thus take longer than normal time to settle to one state or value. At the end of the meta-stable state, the flip-flop may settle down to either a high state (or "1") or a low state (or "0").

Meta-stability may occur in one or more situations including a situation when the input signal is an asynchronous signal, a situation when the clock skew or slew is over a certain threshold (e.g., the rise time and fall time are more than some predetermined or tolerable values), a situation when interfacing two domains operating at two different frequencies or at the same frequency but with different phases; or a situation when the combinational delay is such that flip-flop data input changes in the critical or the setup plus hold window, etc. A CDC effect model (e.g., a CDC effect model for the path 210D) may be a model that is devised to be able to receive a meta-stable signal state or value.

Figure 2E:
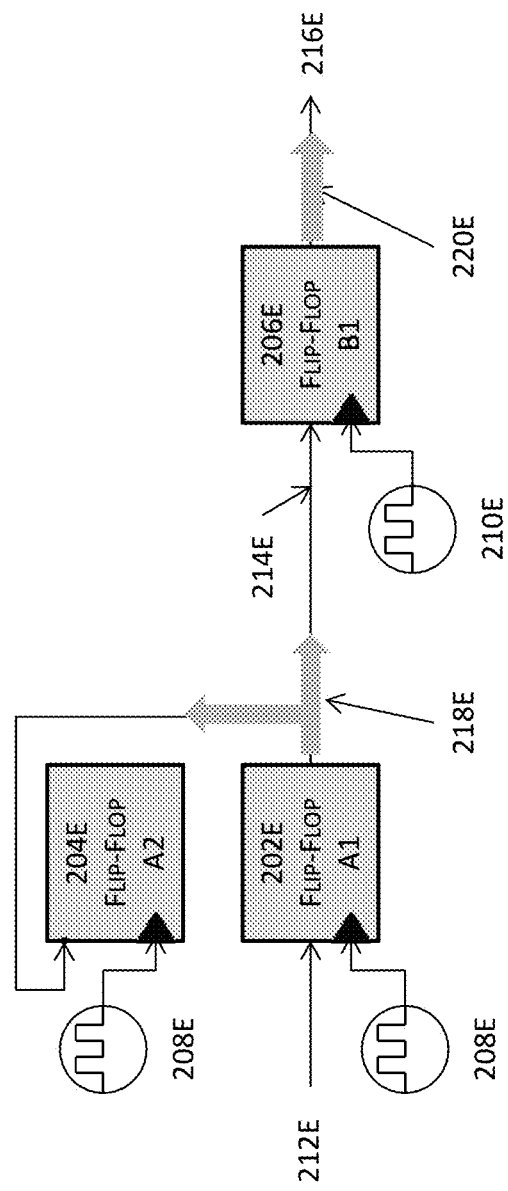
FIG. 2E illustrates some examples of CDC injection rules that may be used in injecting one or more CDC effect modules into a simplified portion of an electronic design having one or more clock domain crossing paths in one or more embodiments.

FIG. 2E illustrates some examples of CDC injection rules that may be used in injecting one or more CDC effect modules into a simplified portion of an electronic design having one or more clock domain crossing paths in one or more embodiments. More specifically, FIG. 2E illustrates a simplified electronic design including three flip-flops 202E, 204E, and 206E. Flip-flops 202E and 204E belong to the first clock domain 208E, and flip-flop 206E belongs to the second clock domain 210E. Flip-flop 202E receives an input from 212E and issues an output to both the input of flip-flop 204E in the same, first clock domain 208E and the input of flip-flop 206E in the second clock domain 210E. Flip-flop 206E receiving the input from the output of flip-flop 202E generates the output via path 216E. The path 214E interconnecting flip-flops 202E as well as 204E and flip-flop 206E constitutes a CDC path because flip-flop 206E belongs to a different clock domain from flip-flops 202E and 204E.

A CDC rule for the simplified electronic design illustrated in FIG. 2E may include the application of a meta-stable signal value or state to the output of flip-flop 206E or the signal propagating along the path 216E. In this particular example, injecting the CDC effect model 220E that incorporates the application of a meta-stable state or value at the output of flip-flop 206E may correctly capture the CDC effect of flip-flops 202E (and hence 204E) and 206E being out of synchronization. It shall be noted that flip-flops 202E and 204E will not become out of synchronization because these two flip-flops belong to the same, first clock domain 208E. Therefore, another CDC rule that may be applied by, for example, the rule mechanism may rule out the CDC path 214E as a possible candidate for CDC effect model injection. This CDC rule controls that two or more flip-flops belonging to the same clock domain are thus synchronous, and therefore no CDC effect model will be injected at the output of these same clock domain flip-flops if an output of one of these flip-flops is transmitted to the input of another one of these flip-flops. That is, this CDC rule will rule out the possibility of injecting a CDC effect model 218E at the output of flip-flop 202E.

Figure 2F:
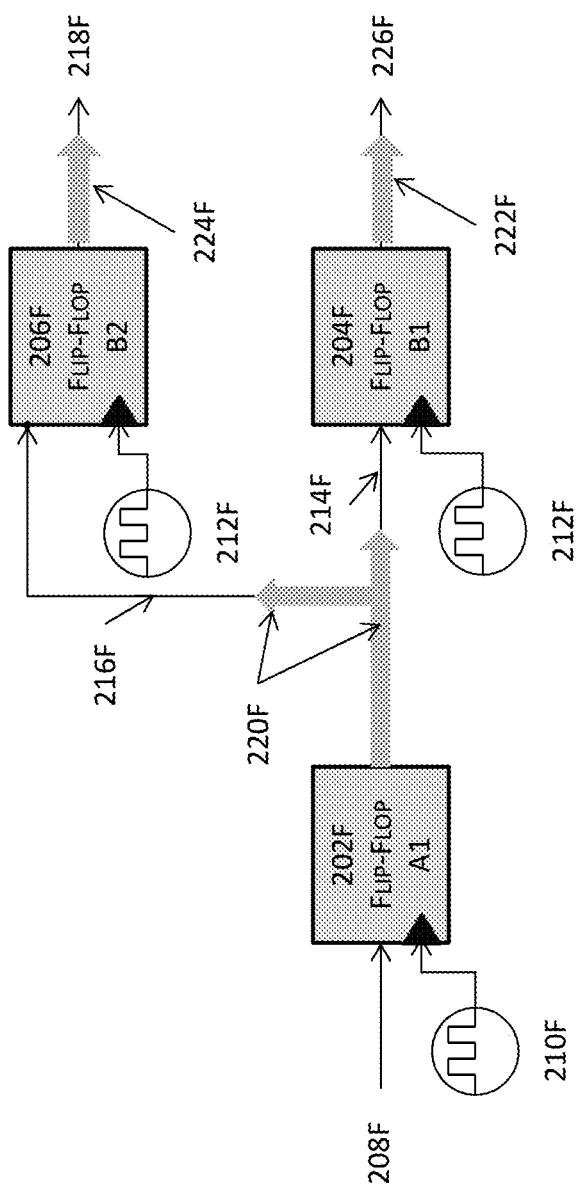
FIG. 2F illustrates some examples of CDC injection rules that may be used in injecting one or more CDC effect modules into a simplified portion of an electronic design having one or more clock domain crossing paths in one or more embodiments.

FIG. 2F illustrates some examples of CDC injection rules that may be used in injecting one or more CDC effect modules into a simplified portion of an electronic design having one or more clock domain crossing paths in one or more embodiments. More specifically, the simplified electronic design includes three flip-flops 202F, 204F, and 206F where flip-flop 202F belongs to the first clock domain 210F, and flip-flops 204F and 206F belong to the second clock domain 212F. Flip-flop 202F receives an input state or value from 208F and generates an output to the inputs of both flip-flop 204F and flip-flop 206F. Flip-flop 204F generates the output via path 226F; and flip-flop 206F generates the output signal 224F transmitted via path 218F.

A CDC rule for the simplified electronic design illustrated in FIG. 2F may include the application of a meta-stable signal value or state to the output of flip-flop 204F or the signal 222F propagating along the path 226F. Because the path 214F connecting flip-flop 202F and flip-flop 204F may be different from the path 218F connecting flip-flop 202F and flip-flop 206F, flip-flops 202F and 206F as well as flip-flops 202F and 204F may become separately out of synchronization. Injecting a single CDC effect model 220F at the output of flip-flop 202F will nevertheless apply the same meta-stable value or state to both flip-flops 204F and 206F. In this case, the injected CDC effect model will fail to capture the scenario where flip-flops 202F and 206F as well as flip-flops 202F and 204F may become separately out of synchronization.

Therefore, the CDC rule may rule out injecting a CDC effect model (e.g., 220F) at the output of flip-flop (e.g., 202F) whose output is transmitted to more than one flip-flop in a different clock domain. The CDC rule may further control that when two or more first flip-flops in the same clock domain receive an input from the same second flip-flop in a different clock domain, a CDC effect model will be injected at the output of each of the first flip-flops, but not at the inputs of these two or more first flip-flops (or the output the second flip-flop).

Figure 2G:
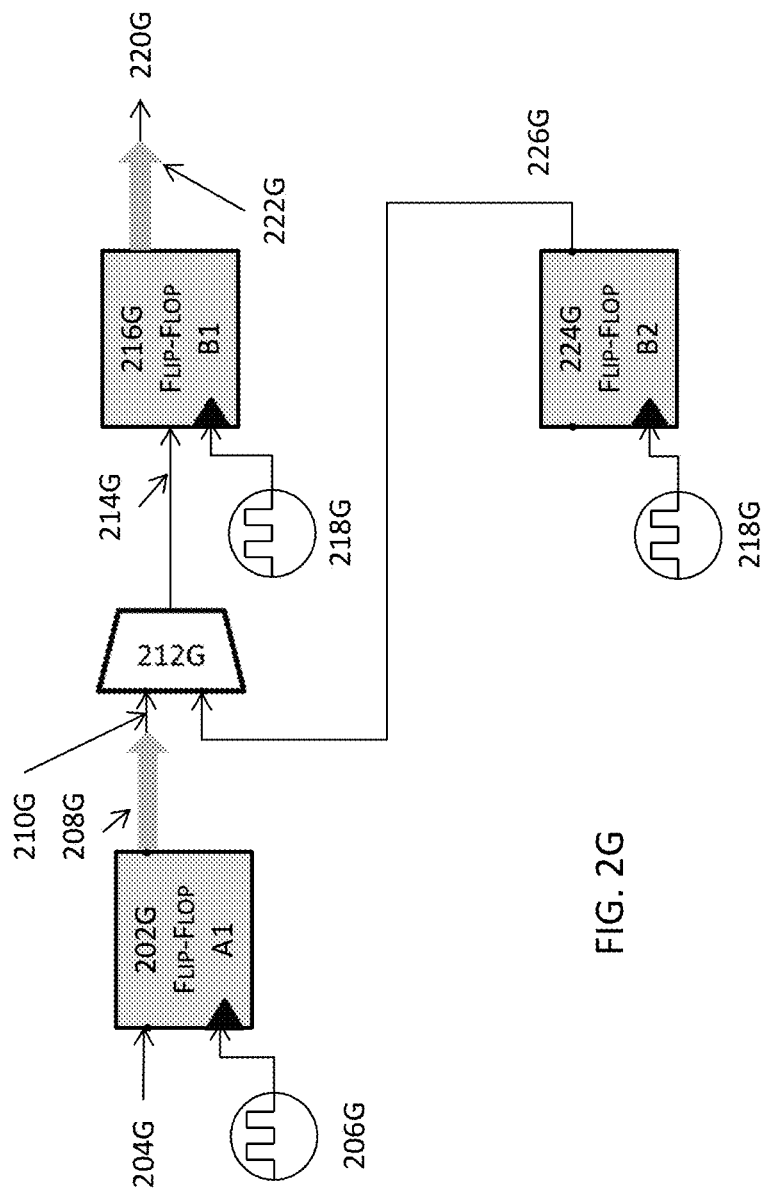
FIG. 2G illustrates some examples of CDC injection rules that may be used in injecting one or more CDC effect modules into a simplified portion of an electronic design having one or more clock domain crossing paths in one or more embodiments.

FIG. 2G illustrates some examples of CDC injection rules that may be used in injecting one or more CDC effect modules into a simplified portion of an electronic design having one or more clock domain crossing paths in one or more embodiments. More specifically, the simplified electronic design includes flip-flop 202G in the first clock domain 206G that receives an input from path 204G and generates an output to a 2-to-1 multiplexer 212G via path 210G. The simplified electronic design further includes two additional flip-flops 216G and 224G in the second clock domain 218G. Multiplexer 212G combines the output of flip-flop 202G via path 210G with the output of flip-flop 224G via path 226G and generates an output that is transmitted via path 214G to the input of flip-flop 216G via path 226G. Flip-flop 216G further generates an output that may be further propagated via path 220G. In this simplified electronic design, one (216G) of the two flip-flops (216G and 224G) in the same, second clock domain 218G is receiving its input from the other flip-flop (224G) in the same, second clock domain and another flip-flop (202G) in a different, first clock domain 206G.

A CDC rule for the simplified electronic design illustrated in FIG. 2F may include the application of a meta-stable signal value or state to the output of the destination flip-flop (216G in this example) when the destination flip-flop receives its inputs from one or more flip-flops in the same clock domain as well as from one or more other flip-flops in one or more different clock domains. Based on this rule, for the path from flip-flop 202G to flip-flop 216G, the rule mechanism may rule out the output of flip-flop 202G as a potential candidate for CDC model injection because doing so will inject a CDC effect model 208G which applies a meta-stable state or value into the input for flip-flop 216G, whereas the input for flip-flop 226G may come from flip-flop 202G or flip-flop 224G. If multiplexer selects the output of flip-flop 224G as the input for flip-flop 212G and hence the input of flip-flop 216G, injection the CDC effect will be incorrect because flip-flop 216G and flip-flop 224G belong to the same clock domain and are thus synchronous. As a result, the rule mechanism may function in tandem with the CDC injection mechanism to inject a CDC effect model 222G at the output of flip-flop 216G along the path 220G.

Figure 3:
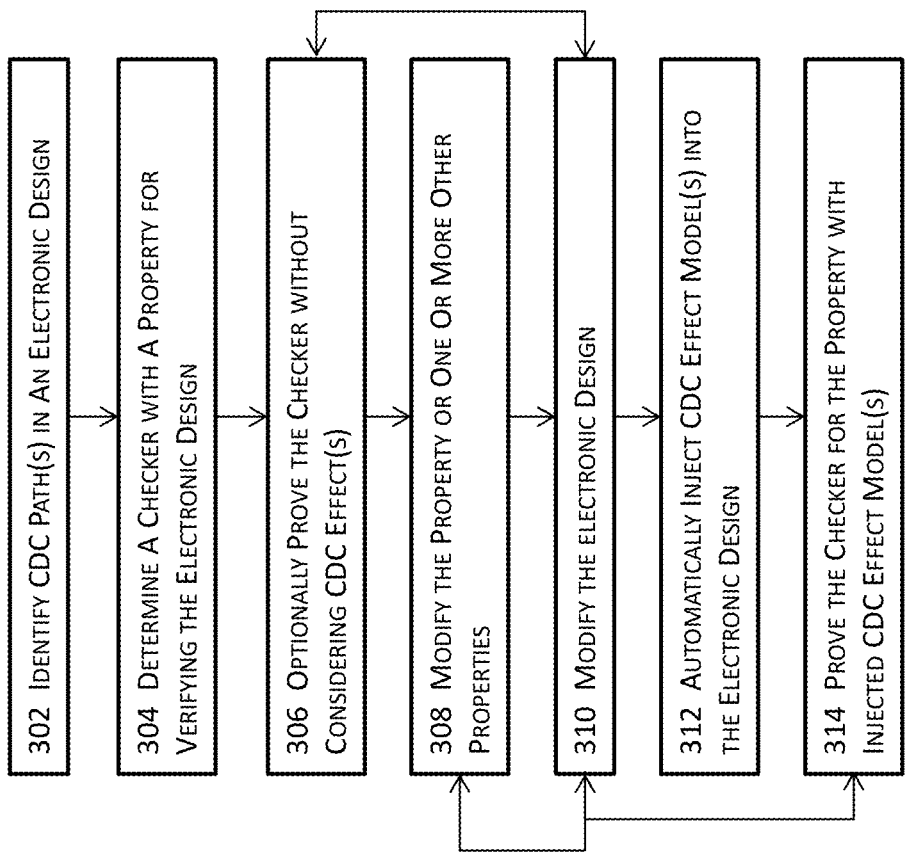
FIG. 3 illustrates a more detailed block diagram for a method or system for verifying an electronic design with clock domain crossing paths in one or more embodiments.

FIG. 3 illustrates a more detailed block diagram for a method or system for verifying an electronic design with clock domain crossing paths in one or more embodiments. In these one or more embodiments illustrated in FIG. 3, one or more CDC paths may be optionally identified in an electronic design having multiple clock domains at 302. These one or more CDC paths may be identified by the design traversal mechanism using, for example, the connectivity information alone or in conjunction with one or more other mechanisms such as the CDC identification mechanism 102 of FIG. 1A.

Each CDC path comprises one or more path segments and connects electronic design components in two or more clock domains. The electronic design may include a partial or complete electronic design at various abstraction levels such as an RTL description, a gate-level description, etc. At 304, a proof checker, a checker, or automated proof checking (hereinafter checker) may be determined for a property for the electronic design or a portion thereof. A checker may be constructed or identified for a property so that the checker may be verified to prove or disprove the property in some of these embodiments. For example, a checker may be constructed for the underlying electronic design or a portion thereof with respect to a formal specification of a property using formal methods.

A property may be specified via, for example, a property specification language (PSL) and include, for example, a forward progress property, a deadlock property or condition, a liveliness property tracking a specific transaction that enters and/or exits an electronic design component or block, a data transport property describing, indicating, or related to how data or payload propagates through in the electronic design, etc. The checker may be optionally proved or disproved via, for example, formal verification or logic simulation, with a verification mechanism or a simulation mechanism to determine whether the electronic design or a pertinent portion thereof conforms to the specification, without referencing any CDC effects at 306. If the checker cannot be proved or disproved, the flow may iteratively modify the property or one or more other properties at 308 and then return to 306 to prove or disprove the checker, without accounting for CDC effects. In addition or in the alternative, the flow may iteratively modify the electronic design at 310 and returns to 308 to prove or disprove the checker. At 312, various techniques described above with reference to FIGS. 1A-D and 2A-G may be used to automatically inject one or more CDC effect models into the electronic design. The checker may then be proved or disproved at 314 with the automatically injected one or more CDC effect models to account for CDC effects.

System Architecture Overview

Figure 5:
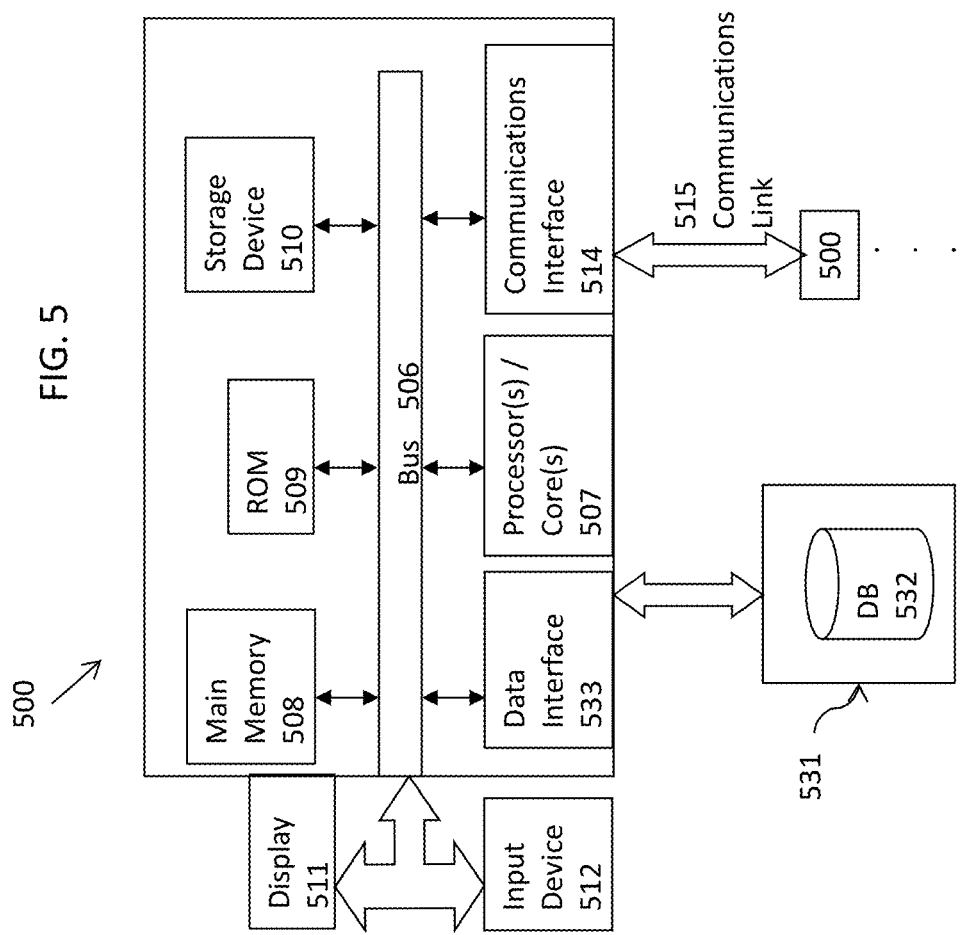
FIG. 5 illustrates a computerized system on which a method for verifying an electronic design with clock domain crossing paths may be implemented.

FIG. 5 illustrates a block diagram of a simplified illustration of a specially programmed computing system 500 on which a method for verifying an electronic design having clock domain crossing paths as described in the preceding paragraphs with reference to various figures. Computer system 500 includes a bus 506 (e.g., a system bus, an external bus, etc.) or other communication mechanisms for communicating information, which interconnects subsystems and devices, such as processor(s) or processor core(s) 507, system memory 508 (e.g., RAM), static storage device 509 (e.g., ROM), disk drive 510 (e.g., magnetic or optical), communication interface 514 (e.g., modem or Ethernet card), display 511 (e.g., CRT or LCD), input device 512 (e.g., keyboard), and cursor control (not shown).

According to one embodiment, computer system 500 performs specific operations by one or more processor or processor cores 507 executing one or more sequences of one or more instructions in system memory 508. Such instructions may be read into system memory 508 from another computer readable/usable storage medium, such as static storage device 509 or disk drive 510. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 507, where the one or more processors, one or more processor cores, or combination thereof executes one or more threads. For example, the act of identifying electronic design components, the act of traversing at least a portion of an electronic design, the act of identifying CDC paths, the act of identifying one or more rules, the act of determining one or more checkers, the act of duplicating electronic design components, the act of injecting CDC effects or CDC effect models, the act of proving or disproving one or more checkers, and/or the act of modifying an electronic design, a checker, and/or a property corresponding to a checker, etc. may be performed by one or more processors, one or more processor cores, or combination thereof.

A mechanisms described herein may also be implemented as a pure hardware module (e.g., a block of electronic circuit components) or a combination of a hardware module and a software block that jointly perform various tasks to achieve various functions or purposes described herein or equivalents thereof. For example, a mechanism described herein may be implemented as an application-specific integrated circuit (ASIC) in some embodiments. A mechanism described herein or an equivalent thereof may perform its respective functions alone or in conjunction with one or more other mechanisms. A mechanism described herein or an equivalent thereof may thus invoke one or more other mechanisms by, for example, issuing one or more commands or function calls. The invocation of one or more other mechanisms may be fully automated or may involve one or more user inputs.

The term "computer readable storage medium" or "computer usable storage medium" as used herein refers to any medium that participates in providing instructions to processor(s) or processor core(s) 507 for execution. Such a medium may take many forms, including but not limited to, non-volatile media and volatile media. Non-volatile media includes, for example, optical or magnetic disks, such as disk drive 510. Volatile media includes dynamic memory, such as system memory 508. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 500. According to other embodiments of the invention, two or more computer systems 500 coupled by communication link 515 (e.g., LAN, PTSN, or wireless network) may perform the sequence of instructions required to practice the invention in coordination with one another.

Computer system 500 may transmit and receive messages, data, and instructions, including program, i.e., application code, through communication link 515 and communication interface 514. Received program code may be executed by processor(s) or processor core(s) 507 as it is received, and/or stored in disk drive 510, or other non-volatile storage for later execution. In an embodiment, the computer system 500 operates in conjunction with a data storage system 531, e.g., a data storage system 531 that includes a database 532 that is readily accessible by the computer system 500. The computer system 500 communicates with the data storage system 531 through a data interface 533. A data interface 533, which is coupled to the bus 506 (e.g., memory bus, system bus, data bus, etc.), transmits and receives electrical, electromagnetic or optical signals that include data streams representing various types of signal information, e.g., instructions, messages and data. In embodiments of the invention, the functions of the data interface 533 may be performed by the communication interface 514.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for verifying an electronic design with clock domain crossing paths, comprising:

executing a process with at least one micro-processor of a computing system, the process comprising:

identifying, at a clock domain crossing (CDC) identification module including or coupled with a design traversal module and at least one micro-processor of a computing system, a first electronic design component for verification of the electronic design at least by traversing at least a portion of the electronic design;

generating a representation of the electronic design at least by interconnecting one or more duplicated electronic design components, which are duplicated from one or more corresponding electronic design components in the electronic design, with the first electronic design component;

injecting one or more CDC effect models into the presentation at least by reducing a set of injection candidates into a reduced set of injection candidates with an application of one or more CDC rules and by adding the one or more CDC effect models along one or more paths associated with the reduced set of injection candidates in the representation of the electronic design; and generating proof results at least via proving or disproving one or more checkers for the electronic design by verifying or simulating the representation with the one or more CDC effect models.

2. The computer implemented method of claim 1, the process further comprising:

identifying a CDC path operatively coupled with the first electronic design component in the electronic design, wherein at least one CDC rule of the one or more CDC rules is used at least to identify a first electronic design component that is time-dependent and includes multiple inputs and to determine whether the multiple inputs of the first electronic design component correspond to different clock domains.

3. The computer implemented method of claim 1, the process further comprising:

identifying a destination electronic design component as the first electronic design component associated with a CDC path that connects two or more clock domains.

4. The computer implemented method of claim 3, the process further comprising:

identifying one or more fan-in electronic design components for the first electronic design component, wherein the design traversal module backward traverses at least a portion of the electronic design.

5. The computer implemented method of claim 4, the process further comprising:

duplicating the one or more electronic design components into the one or more duplicated electronic design components in the representation of the electronic design; and interconnecting the one or more duplicated electronic design components in the representation by using at least connectivity information of the electronic design.

6. The computer implemented method of claim 1, wherein the representation of the electronic design includes an in-memory representation of the electronic design, and the one or more duplicated electronic design components are interconnected in the in-memory representation of the electronic design by using at least connectivity information of the electronic design.

7. The computer implemented method of claim 1, determining the representation of the electronic design further comprising:

removing a path in the representation of the electronic design; and creating at least one additional path by interconnecting the first electronic design component with at least one duplicated electronic design component of the one or more electronic design components.

8. The computer implemented method of claim 1, the process further comprising:

identifying the one or more CDC rules for the electronic design; and determining one or more locations for the one or more CDC effect models in the representation of the electronic design based in part or in whole upon the one or more CDC rules.

9. The computer implemented method of claim 8, the one or more CDC rules including:

identifying a first time-dependent electronic design component having multiple inputs;

determining whether the multiple inputs belong to different clock domains; and injecting a first CDC effect model at an output of the time-dependent electronic design component, where the multiple inputs of the time-dependent electronic design component are determined to belong to the different clock domains.

10. The computer implemented method of claim 8, the one or more CDC rules including:

identifying a second time-dependent electronic design component having an output propagated to multiple electronic design components;

determining whether the multiple electronic design components belong to a same clock domain; and injecting a second CDC effect model at outputs of the multiple electronic design components, where the multiple electronic design components are determined to belong to the same clock domain.

11. The computer implemented method of claim 1, the process further comprising:

performing an iterative process, the iterative process comprising:

determining a property corresponding to at least one checker of the one or more checkers;

modifying the electronic design, the at least one checker, or the property by making one or more changes based in part or in whole upon the proof results for the at least one checker;

proving or disproving the at least one checker with the one or more changes; and committing the one or more changes into a persistent storage device.

12. An article of manufacture comprising a non-transitory computer accessible storage medium having stored thereupon a sequence of instructions which, when executed by at least one processor, causes the at least one processor to perform a set of acts for verifying an electronic design with clock domain crossing paths, the set of acts comprising:

executing a process with at least one micro-processor of a computing system, the process comprising:

identifying, with an aid of a clock domain crossing (CDC) identification module coupled with at least one microprocessor of a computing system and a design traversal module, a first electronic design component at least by traversing at least a portion of the electronic design;

generating a representation of the electronic design at least by interconnecting one or more duplicated electronic design components, which are duplicated from one or more corresponding electronic design components in the electronic design, with the first electronic design component;

injecting one or more CDC effect models into the representation at least by reducing a set of injection candidates into a reduced set of injection candidates with an application of one or more CDC rules and by adding the one or more CDC effect models along one or more paths associated with the reduced set of injection candidates in the representation of the electronic design; and generating proof results at least by proving one or more checkers for the electronic design by verifying or simulating the representation with the one or more CDC effect models.

13. The article of manufacture of claim 12, further comprising the sequence of instructions which, when executed by at least one processor, causes the at least one processor to perform the process that further comprises:

identifying a CDC path operatively coupled with the first electronic design component in the electronic design.

14. The article of manufacture of claim 12, further comprising the sequence of instructions which, when executed by at least one processor, causes the at least one processor to perform the process that further comprises:

identifying a destination electronic design component as the first electronic design component associated with a CDC path that connects two or more clock domains; and identifying one or more fan-in electronic design components for the first electronic design component, wherein the design traversal module backward traverses at least a portion of the electronic design.

15. The article of manufacture of claim 14, further comprising the sequence of instructions which, when executed by at least one processor, causes the at least one processor to perform the process that further comprises:

duplicating the one or more electronic design components into the one or more duplicated electronic design components in the representation of the electronic design; and interconnecting the one or more duplicated electronic design components in the representation by using at least connectivity information of the electronic design.

16. The article of manufacture of claim 12, further comprising the sequence of instructions which, when executed by at least one processor, causes the at least one processor to perform the process that further comprises:

identifying one or more CDC rules for the electronic design; and determining one or more locations for the one or more CDC effect models in the representation of the electronic design based in part or in whole upon the one or more CDC rules.

17. A system for verifying an electronic design with clock domain crossing paths, comprising:

non-transitory computer accessible storage medium storing thereupon program code;

a verification suite including or coupled with clock domain crossing (CDC) identification module and at least one micro-processor of a computing system that executes the program code to identify a first electronic design component at least by traversing at least a portion of the electronic design;

the micro-processor further executes the program code at least to:

generate a representation of the electronic design at least by interconnecting one or more duplicated electronic design components, which are duplicated from one or more corresponding electronic design components in the electronic design, with the first electronic design component;

injecting one or more CDC effect models into the representation at least by reducing a set of injection candidates into a reduced set of injection candidates with an application of one or more CDC rules and by adding the one or more CDC effect models along one or more paths associated with the reduced set of injection candidates in the representation of the electronic design; and generate proof results at least by proving one or more checkers for the electronic design by verifying or simulating the representation with the one or more CDC effect models.

18. The system of claim 17, the micro-processor further executes the program code at least to:

identify a destination electronic design component as the first electronic design component associated with a CDC path that connects two or more clock domains; and identify one or more fan-in electronic design components for the first electronic design component, wherein the design traversal module backward traverses at least a portion of the electronic design.

19. The system of claim 18, the micro-processor further executes the program code at least to:

duplicate the one or more electronic design components into the one or more duplicated electronic design components in the representation of the electronic design; and interconnect the one or more duplicated electronic design components in the representation by using at least connectivity information of the electronic design.

20. The system of claim 17, the micro-processor further executes the program code at least to:

iteratively determine a property corresponding to at least one checker of the one or more checkers; modify the electronic design, the at least one checker, or the property by making one or more changes based in part or in whole upon the proof results for the at least one checker; prove the at least one checker with the one or more changes; and commit the one or more changes into a persistent storage device.

* * * * *